United States Patent
Nishiya et al.

[11] Patent Number: 5,940,416
[45] Date of Patent: Aug. 17, 1999

[54] DIGITAL SIGNAL DECODING APPARATUS AND A DECODING METHOD USED THEREIN

[75] Inventors: Takushi Nishiya, Machida, Japan; Hideyuki Yamakawa, San Jose, Calif.; Shoichi Miyazawa, deceased, late of Yokohama, Japan, by Yukie Miyazawa, heir; Seiichi Mita, Kanagawa-ken, Japan; Yoichi Uehara, Maebashi, Japan; Takashi Nara, Takasaki, Japan; Akihiko Hirano, Odawara, Japan

[73] Assignee: Hitachi Ltd., Tokyo, Japan

[21] Appl. No.: 08/881,508

[22] Filed: Jun. 24, 1997

[30] Foreign Application Priority Data

Jun. 28, 1996 [JP] Japan ................................. 8-168976

[51] Int. Cl.$^6$ .................................................. H03M 13/00
[52] U.S. Cl. ............................................................ 371/43.7
[58] Field of Search ................................... 371/43.7, 43.6, 371/43.2, 43.4, 43.8, 43.5, 43.1; 375/290, 340, 262, 263, 264, 265, 341

[56] References Cited

U.S. PATENT DOCUMENTS 4,777,363 10/1988 Yamashita et al. ...................... 371/43
5,430,744 7/1995 Fettweis et al. .......................... 371/43

*Primary Examiner*—Paul P. Gordon
*Assistant Examiner*—McDieunel Marc
*Attorney, Agent, or Firm*—Fay, Sharpe, Beall, Fagan, Minnich & McKee

[57] ABSTRACT

A calculation concerning the input of a signal is removed from a branch metric calculation processing on a trellis diagram of an extended partial response class, and the calculation of branch metrics and the selection of survivor paths can be carried out by the subtraction of the survivor paths and the comparison of constants.

9 Claims, 14 Drawing Sheets

FIG. 10A

| NODE NO. | | NODE 0 | NODE 2 | NODE 4 | NODE 6 |
|---|---|---|---|---|---|
| PATH METRIC TO BE COMPARED | | $M_0-4$<br>$M_1-2$<br>$M_2$<br>$M_3+2$ | $M_0$<br>$M_1$<br>$M_2$<br>$M_3$ | $M_0-2$<br>$M_1$<br>$M_2$<br>$M_3+2$ | $M_0+2$<br>$M_1+2$<br>$M_2$<br>$M_3$ |
| CONSTANS TO BE COMPARED WITH DIFFERENCES OF SURVIVOR PATH METRICS | $M_0-M_1\approx$<br>$M_0-M_2\approx$<br>$M_0-M_3\approx$<br>$M_1-M_2\approx$<br>$M_1-M_3\approx$<br>$M_2-M_2\approx$ | 2<br>4<br>6<br>2<br>4<br>2 | 0<br>0<br>0<br>0<br>0<br>0 | 2<br>2<br>4<br>0<br>2<br>2 | 0<br>-2<br>-2<br>-2<br>-2<br>0 |

FIG. 10B

| NODE NO. | | NODE 1 | NODE 3 | NODE 5 | NODE 7 |
|---|---|---|---|---|---|
| PATH METRIC TO BE COMPARED | | $M_4$<br>$M_5$<br>$M_6+2$<br>$M_7+2$ | $M_4+2$<br>$M_5$<br>$M_6$<br>$M_7-2$ | $M_4$<br>$M_5$<br>$M_6$<br>$M_7$ | $M_4+2$<br>$M_5$<br>$M_6-2$<br>$M_7-4$ |
| CONSTANS TO BE COMPARED WITH DIFFERENCES OF SURVIVOR PATH METRICS | $M_4-M_5\approx$<br>$M_4-M_6\approx$<br>$M_4-M_7\approx$<br>$M_5-M_6\approx$<br>$M_5-M_7\approx$<br>$M_6-M_7\approx$ | 0<br>2<br>2<br>2<br>2<br>0 | -2<br>-2<br>-4<br>0<br>-2<br>-2 | 0<br>0<br>0<br>0<br>0<br>0 | -2<br>-4<br>-6<br>-2<br>-4<br>-2 |

DIGITAL SIGNAL DECODING APPARATUS AND A DECODING METHOD USED THEREIN

BACKGROUND OF THE INVENTION

The present invention relates to an apparatus, such as a magnetic disk apparatus for decoding a digital signal encoded and recorded by a partial response and a decoding method used in such an apparatus.

A magnetic recording channel in a hard disk or the like has a frequency response similar to that of an arrangement in which a differentiator and a low-pass filter are connected in series. In the magnetic recording channel, an intersymbol interference thereof is modeled as a partial response channel having an impulse response of $1-D^2$ or $1+D-D^2-D^3$.

In the magnetic recording channel in which the intersymbol interference is modeled by the impulse response of $1-D^2$, a binary code of 1 and 0 (or generally +a, −a) is outputted in the form of a ternary code of +1, 0 and −1 (or +c, 0, −c). A magnetic recording channel that is modeled by an impulse response of $1+D-D^2-D^3$ is referred to as "Extended Partial Response Class 4" (hereinafter simply referred to as "EPR4"). In this channel, the binary code of 1 and 0 (or generally +a, −a) is outputted in the form of a quinary code of +2, +1, 0, −1, −2 (or +2c, +c, 0, −c, −2c).

As described above, in the magnetic recording channel, the binary code is converted into a ternary or quinary signal due to the intersymbol interference. Therefore, it is necessary to decode a digital signal in such a manner that a binary code of 1 and 0 is generated from a ternary or quinary data symbol sequence.

The above-mentioned magnetic recording channel can be expressed as an arbitrary finite-state machine having N states ($N=2^{m-1}$ is satisfied when m is the storage memory capacity of a convolutional code encoder). A two-dimensional graph in which the states (N number) of a certain time k of this finite-state machine are expressed by nodes arranged in the longitudinal direction and the transitions from the respective states to respective states of a time (k+1) are expressed by branches is generally referred to as "trellis diagram".

A Viterbi algorithm is used to search the shortest path on this trellis algorithm. The Viterbi algorithm becomes equivalent to a dynamic programming problem for optimization of a multistage decision process. A Viterbi decoder based on this Viterbi algorithm is adapted to estimate a transmission sequence in a certain band-limited channel having an intersymbol interference according to a maximum likelihood estimation. Specifically, the Viterbi decoder is adapted to select from a possible code sequence a code sequence which minimizes a distance metric (distance function) concerning a sequence of a received signal, such as a total sum of a square-error of a sequence of a received signal. In this sense, the Viterbi decoder has an error-correction capability. This Viterbi decoder generates and decodes a binary code of 1 and 0 from the above-mentioned ternary or quinary data symbol sequence.

As is well-known, the Viterbi decoder has complexities from a circuit standpoint, and it takes plenty of time for the Viterbi decoder to calculate data. The following paper has described a method of simplifying the circuit arrangement of the Viterbi decoder.

Reduced-complexity Viterbi Detector Architectures for Partial Response Signaling, G. Fettweise, R. Karabed, P. Siegel, and H. Thapar, GLOBECOM95, IEEE Cat. No. 0-78032509-5/95, pp. 559–563, Nov. 1995.

However, according to the method described in the above-mentioned paper, although the circuit arrangement of the Viterbi decoder can be simplified by the circuit system using the above-mentioned transformed trellis, there still remains such a problem that an operation speed cannot be improved. Incidentally, a patent that corresponds to the above-mentioned paper is a U.S. Pat. No. 5,430,744.

In the magnetic disk apparatus or the like using the above-mentioned Viterbi decoder, there is an increasing demand of increasing a storage capacity while maintaining a high rotational speed of a magnetic disk in order to effect a high-speed access. To this end, although it is necessary to raise a transfer rate at which data is transferred from a recording medium, there is then the problem that a low operation speed of the Viterbi decoder hinders a data transfer rate from increasing, thereby making it impossible to increase a storage capacity.

Furthermore, the following papers have described a method which can realize a high-speed operation of the Viterbi decoder.

Minimized Method Viterbi decoding: 600 Mbit/s Per Chip, Gerhard Fettweise, Herbert Dawid, Heinrich Meyr, IEEE 1990 Global Telecommunications Conference (GLOBECOM '90), pp. 1712–1716.

A 210 Mb/s Radix-4 Bit-level Pipelined Viterbi Decoder, Alfred K. Yeung. Jan M. Rabaey, 1995 IEEE International Solid-State Circuits Conferences. pp. 88–89, Paper WP 5.6, Slide Supplement pp. 68–69.

However, although the above-mentioned methods that had been described in the aforementioned papers can realize the high-speed processing of the Viterbi decoder, there still remains such a problem that the circuit arrangement of the Viterbi decoder becomes complex more than twice.

As a consequence, the whole of the apparatus such as the magnetic disk apparatus using the above-mentioned Viterbi decoder becomes expensive. Moreover, since the circuit arrangement of the Viterbi decoder has complexities as described above, an LSI (large-scale integration) package becomes large in size so that the apparatus using the Viterbi decoder cannot be miniaturized as it is expected.

SUMMARY OF THE INVENTION

It is therefore an object of the present invention to provide a Viterbi decoder capable of a high-speed processing and in which an increase of complexities of a circuit arrangement can be suppressed, a digital signal decoding apparatus using the Viterbi decoder and a magnetic recording and reproducing apparatus such as a hard disk using the Viterbi decoder.

It is another object of the present invention to provide a digital signal decoding apparatus of which the signal processing speed can be increased and a magnetic recording and reproducing apparatus such as a hard disk apparatus using the digital signal decoding apparatus in which a transfer rate can be increased and a storage capacity can be increased.

It is a further object of the present invention to provide a digital signal decoding apparatus of which the circuit scale can be reduced and a magnetic recording and reproducing apparatus such as a hard disk apparatus using the digital signal decoding apparatus in which a storage capacity can be increased and which can be produced inexpensively.

It is still a further object of the present invention to provide a digital signal decoding apparatus in which a circuit scale can be reduced and a magnetic recording and reproducing apparatus such as a hard disk apparatus using the digital signal decoding apparatus in which a storage capacity can be increased and which can be miniaturized in size.

To attain the aforementioned objects, according to the present invention, a trellis operation of two stages or more shown in FIG. 8 is transformed into a trellis operation of one stage shown in FIG. 9, and digital data can be processed by one operation step.

Specific arrangements according to the present invention are summarized as follows. In the following description, one stage operation will be defined as an operation carried out from a time N to a time N+1 (N is an integer).

According to the present invention, there is provided a Viterbi decoder for generating a binary code sequence from a convolutional coding input data symbol sequence by a maximum likelihood estimation. This Viterbi decoder comprises a branch metric operation unit for calculating branch metric nominates, which had been calculated by n stages (n≧2), at every node independently of metrics of survivor paths by using input signals and constants of a plurality of consecutive stages, and an add-compare-select unit for selecting a survivor path reaching the n-stage calculated state and a branch metric of every node from metrics of each node of a present time, and adding the branch metric of every node to a metric of the selected survivor path.

The add-compare-select unit according to the present invention comprises a unit for generating a survivor sequence pointer to decide a survivor path by comparing metric differences of respective nodes of the present time and constants, a compare-select unit for selecting a metric of a survivor path reaching the n-stage calculated state by using the survivor sequence pointer and outputting the thus selected metric of the survivor path, a selector unit for selecting a branch metric of every node by using the survivor sequence pointer, and an adder unit for adding a branch metric of every node to the metric of the survivor path thus selected.

Further, the present invention is characterized in that n=2.

Further, the present invention is characterized in that the convolutional coding input signal sequence is an extended partial response class 4.

Further, the compare-select unit according to the present invention includes a register for holding four survivor metrics, six metric subtractors for receiving metrics of the four survivor paths thus held and calculating a difference among the respective metrics, a comparator for comparing the difference results thus obtained with a plurality of constants, a decoder for receiving compared results and outputting a survivor sequence pointer, and a selector for selecting a metric of a new survivor path from the metrics of the inputted four survivor paths based on a decision signal.

Further, the present invention is characterized in that the convolutional coding input data symbol sequence is an extended partial response class 4 ($E^m PR4$) extended to m-tuple (m≧2).

According to the present invention, there is provided a digital signal decoding apparatus for decoding a binary code sequence from a read data symbol sequence read out from a magnetic recording medium. This digital signal decoding apparatus comprises a Viterbi decoder which includes a branch metric operation unit for calculating branch metric nominates, which had been calculated by n stages (n≧2), at every node independently of a metric of survivor path by using input signals and constants of a plurality of consecutive stages, and an add-compare-select unit for selecting a survivor path reaching the n-stage calculated state and a branch metric of every node from a metric of each node of a present time, and adding the branch metric of every node to a metric of the selected survivor path.

Furthermore, the present invention comprises a magnetic recording medium on which encoding data encoded from a binary code sequence by using a convolutional code is recorded, a read unit for reading out the encoded data from the magnetic recording medium, and a digital signal decoding apparatus for decoding a binary code sequence from a read data symbol sequence read out from the magnetic recording medium as the encoded data by the read unit. The digital signal decoding apparatus includes a Viterbi decoder comprising a branch metric operation unit for calculating branch metric nominates, which had been calculated by n stages (n≧2), at every node independently of a metric of a survivor path by using read data symbol sequences and constants of a plurality of consecutive stages in order to generate a binary code sequence from the read data symbol sequence according to the maximum likelihood estimation, and an add-compare-select unit for selecting a survivor path reaching the calculated state of n stages and a branch metric of every node from metrics of each node of the present time, and adding the branch metric of every node to a metric of the survivor path thus selected.

Furthermore, according to the present invention, there is provided a decoding method of decoding a binary code sequence from input data symbol sequences of a plurality of stages, the input data symbol sequences being successively inputted and which are encoded by a partial response class 4, according to a maximum likelihood estimation. This decoding method comprises the steps of selecting a survivor path reaching respective n stage (n≧2) calculated states by comparing differences among the survivor paths of each node of the present time with constant values unrelated to a recursive step, calculating branch metric nominates, which had been calculated in n stages, at every node independently of the metric of the survivor path by using inputted data and constants of a plurality of consecutive stages, selecting a branch metric from the branch metric nominates based on the selected survivor path of n stages later, and obtaining a metric of a survivor path of n stages later by adding the branch metric thus selected to the metric of the selected survivor path.

As described above, according to the present invention, it is possible to provide a Viterbi decoder of an extended partial response class 4 in which a processing can be carried out at high speed and in which an increase of complexities of a circuit arrangement can be suppressed.

BRIEF DESCRIPTION OF THE DRAWINGS

FIGS. 10A and 10B are tables showing constants which are compared with differences of survivor path metrics according to the present invention, respectively;

DESCRIPTION OF THE PREFERRED EMBODIMENTS

Embodiments of a digital signal decoding apparatus according to the present invention will hereinafter be described with reference to the drawings.

In the following embodiments, there will be described a magnetic recording and reproducing system in and from which magnetic data is recorded and reproduced. However, the present invention is not limited to the magnetic recording and reproducing system, and may be similarly applied to a reproducing apparatus exclusively designed for reproducing magnetic recorded data, for example.

Figure 17:
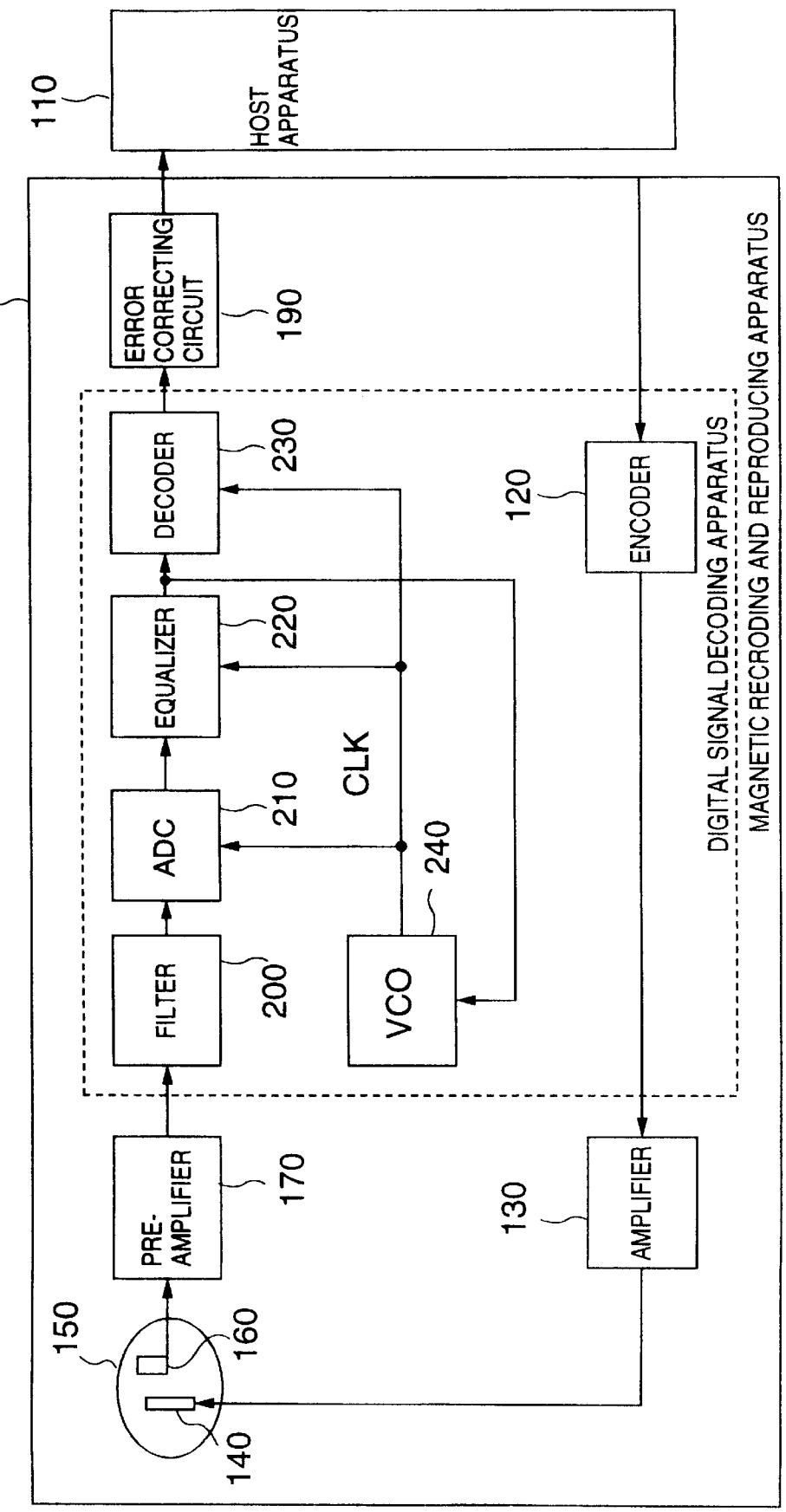
FIG. 17 is a schematic block diagram showing a magnetic recording and reproducing system to which the present invention is applied.

FIG. 17 is a schematic block diagram showing the above-mentioned magnetic recording and reproducing system. A magnetic recording and reproducing system, generally depicted at reference numeral 100 in FIG. 17, is adapted to record data outputted from a host apparatus 110 such as a computer on a recording medium 150, and is also adapted to read out magnetic recorded data from the recording medium 150. Then, the magnetic recording and reproducing system 100 outputs the magnetic data thus read out to the host apparatus 110. As shown in FIG. 17, for example, the magnetic recording and reproducing system 100 includes an encoder 120, an amplifier 130 and a write head 140 as main components for writing data on the recording medium 150. Furthermore, the magnetic recording and reproducing system 100 includes a read head 160, a digital signal decoding apparatus 180 and an error correcting circuit 190 as main components for reading out data from the recording medium 150.

In the digital signal decoding apparatus 180 to which the present invention is applied, read data symbol sequence, which is read out from the recording medium 150 by the read head 160, is amplified by a preamplifier 170, and then supplied to a filter 200, in which its high-frequency noise is eliminated. Then, the read data symbol sequence of which the high-frequency noise was eliminated by the filter 200 is converted by an ADC (analog-to-digital converter) 210 into a digital signal, and supplied to an equalizer 220, in which it is equalized for decoding. In the equalizing, an amplitude characteristic and a phase characteristic of a reproduced signal are shaped such that a digital signal having an analog-like value can be easily discriminated as an original digital signal of "1" or "0".

A decoding circuit 230, which is a main component of the present invention, receives the equalized read data symbol sequence as the input data symbol sequence, and reproduces the equalized read data symbol sequence as a digital signal, i.e. binary code sequence which is not yet encoded. A VCO (voltage-controlled oscillator) 240 generates a clock signal CLK 250, which determines an operation timing of each unit, in response to an output from the equalizer 220.

According to the present invention, the above-mentioned digital signal decoding apparatus 180 can attain the aforementioned objects of the present invention by replacing the conventional decoder 230 with a decoder in which an increase of a circuit scale can be suppressed and which can be operated at high speed which will be described below.

In the present invention, in each node of a trellis diagram, a calculation of a survivor path is carried out by one ACS (Add-Compare-Select) calculation at every plurality of sampling periods. As will be described later on, this is based on the fact that a trellis structure of two stages (sampling periods), for example, is transformed into four trellis states, which can be realized by six adders.

Specifically, a Viterbi decoding method according to the present invention comprises the steps of (a) selecting survivor paths reaching respective calculated states of a plurality of stages by comparing differences among metrics of respective nodes of the present time with constant values unrelated to the recursive step; and (b) adding branch metrics shifted in the respective nodes in the calculated states of a plurality of stages based on a trellis diagram in which a plurality of consecutive sampling data are modified in such a manner that metric calculations concerning respective sample data are shifted to the outside of metric comparison and path selection calculations on the trellis diagram.

Prior to describing the present invention, an encoder of EPR4 (hereinafter simply referred to as "encoder") 5 will be described with reference to a conceptual diagram of FIG. 1A and a state diagram of FIG. 1B. The encoder 5 expresses a channel characteristic and a convolutional coding of a recording code in the combined form, and its impulse response $(G(D)=1+D-D^2-D^3$ where D is the unit delay) demonstrates a characteristic close to the magnetic recording channel. The encoder 5 receives a binary input waveform at a sampling rate of 1/T, and generates a quinary output at the same rate.

Figure 1A:
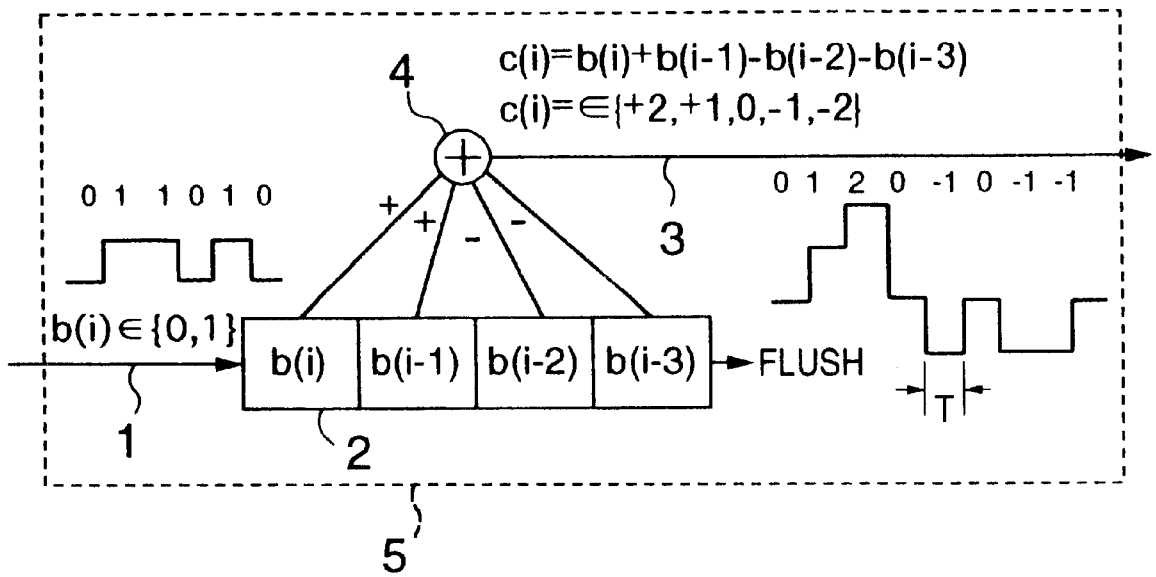
FIG. 1A is a schematic block diagram showing an extended partial response waveform encoder according to the prior art.

In the encoder 5 shown in FIG. 1A, a binary input is supplied through a path 1, and inputted to a shift register 2. An output c(i) that is outputted from the encoder 5 through a path 3 becomes a quinary output $\{+2, +1, 0, -1, -2\}$ as a calculated result of an adder 4 for b(i), b(i-1), b(i-2), b(i-3). The three registers b(i-3), b(i-2), b(i-1) are adapted to express states {000, 001, 010, 011, 100, 101, 110, 111} of 8 different finite-state machines as shown in FIG. 1B.

Input and output of the encoder 5 are labeled to the transition between the states. When '0' is inputted in the state of 000, for example, the encoder 5 generates 0 as an output, and the state of the encoder 5 is maintained at 000, which state is expressed in the form of "0/0". On the other hand, when the encoder 5 begins with the state of 000 and receives an input of 1, the encoder 5 generates an output of 1, and transited to the state of 001. This is also true when the encoder 5 is transited from other states.

Figure 1B:
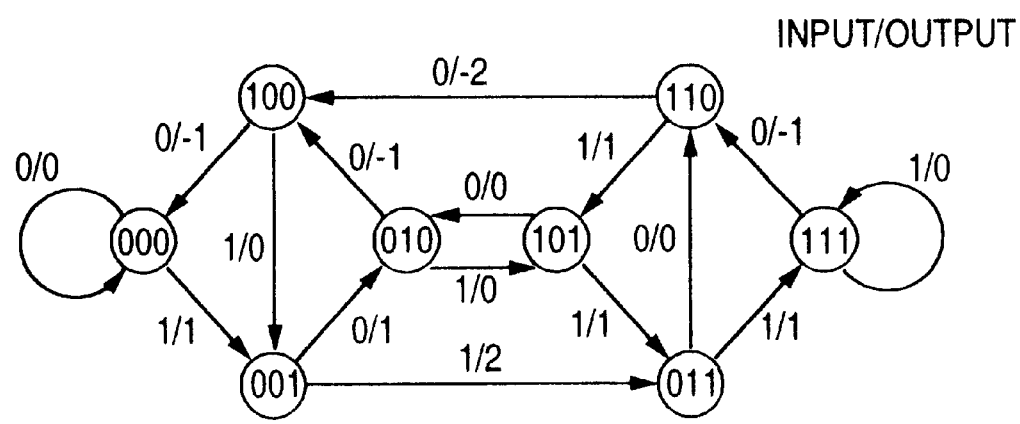
FIG. 1B is a state diagram used to explain the extended partial response waveform encoder shown in FIG. 1A.
Figure 2:
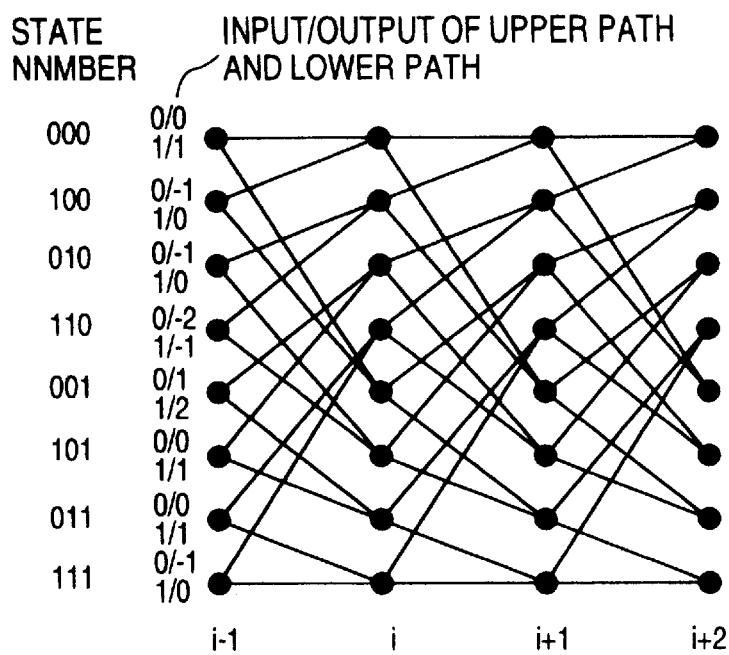
FIG. 2 is a diagram showing a trellis diagram of an extended partial response class 4 according to the prior art.

FIG. 2 shows a trellis diagram corresponding to the state diagram of FIG. 1B. As shown in FIG. 2, the trellis diagram is a directed graph and each node thereof expresses the state in which the encoder is placed at a time i. Each branch expresses a transition from the state of the time i to the next time i+1. Specifically, an ordinate shows the state corresponding to the node of the state diagram, and an abscissa shows a time (calculation between two times is referred to as "stage calculation"). When an input sequence of 1, 1, 0, 0, 0 which starts in the state of 000 at the time i-1 is passed through a channel having an impulse response of $G(D)=1+D-D^2-D^3$, the encoder 5 generates a quinary output of 1, 2, 0, -2, -1. When the same sequence begins with the state of 111, a generated output becomes 0, 0, -1, -2, -1. From a circuitry standpoint, it is customary that the starting state is set to a default state (000) by a reset signal in order to eliminate the above-mentioned ambiguity.

Figure 3:
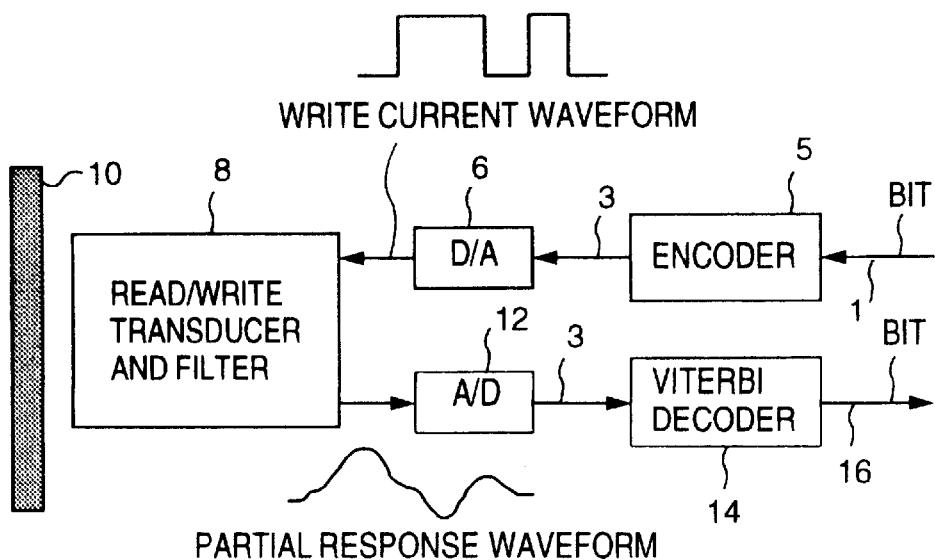
FIG. 3 is a schematic block diagram showing an arrangement in which a Viterbi decoder according to the prior art is used to make a magnetic recording channel.

FIG. 3 is a block diagram showing a Viterbi decoder, an encoder and a magnetic recording channel. As shown in FIG. 3, a read/write transducer or head and filter assembly (hereinafter simply referred to as "head and filter assembly") 8 varies a magnetic state of a medium 10 when data is written in the medium 10, and detects the state of a track when data is read out from the medium 10. The read/write transducer corresponds to the heads 140, 160 shown in FIG. 17; a digital-to-analog converter (hereinafter simply referred to as "D/A converter") 6 is included in the amplifier 130 shown in FIG. 17; the filter corresponds to the filter 200 shown in FIG. 17; and an analog-to-digital converter (hereinafter simply referred to as "A/D converter") 12 corresponds to the ADC 210 shown in FIG. 17. Although the equalizer 220 shown in FIG. 17 is omitted from FIG. 3 in order to simplify the description, in actual practice, an output from the A/D converter 12 is equalized by the equalizer, and then inputted to a Viterbi decoder 14.

An operation of the arrangement shown in FIG. 3 will be described next. Initially, a binary code sequence is supplied to the encoder 5, and a code sequence from the encoder 5 is supplied to the D/A converter 6. An analog signal which changes with time is outputted from the D/A converter 6, and supplied to the head and filter assembly 8 in the write direction. Similarly, an analog output which changes with time from the head and filter assembly 8 is supplied to the A/D converter 12. An EPR 4 output outputted from the A/D converter 12 is supplied through a path 13 to the Viterbi decoder 14 in the order in which it is are read out from the medium 10. The Viterbi decoder 14 outputs a bit sequence of maximum likelihood estimation concerning the first recorded data onto a path 16. The EPR4 output is a quinary output of {+2, +1, 0, -1, -2}.

Figure 4:
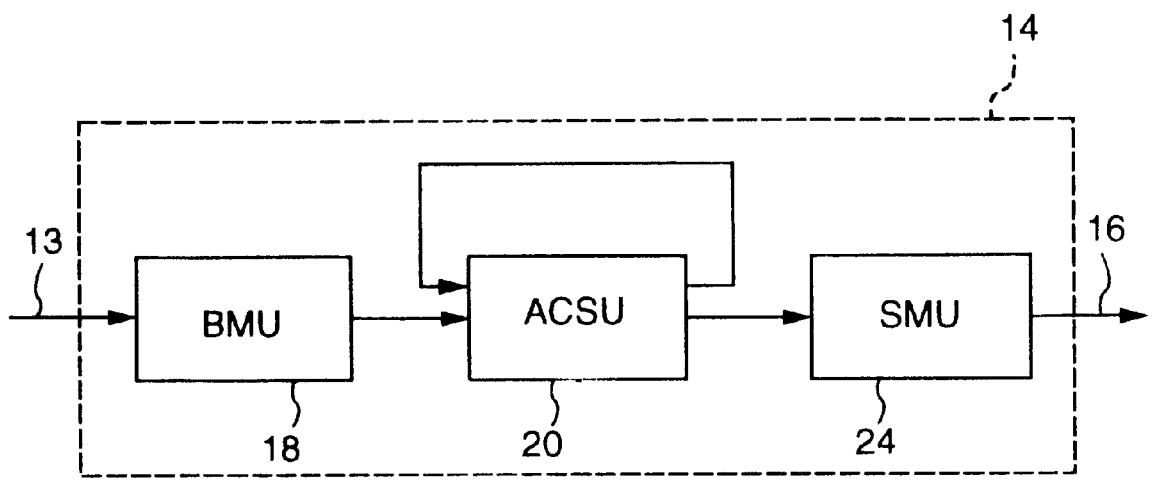
FIG. 4 is a schematic block diagram showing a logical arrangement of a Viterbi decoder.

FIG. 4 shows a logical arrangement of the Viterbi decoder 14. In FIG. 4, reference numeral 18 denotes a branch metric unit (hereinafter simply referred to as "BMU"), and reference numeral 20 denotes an add-compare-select unit (hereinafter simply referred to as "ACSU") having a recursive path 22. The ACSU 20 is adapted to function as a Viterbi detector. Reference numeral 24 denotes a survivor-path-memory unit (hereinafter simply referred to as "SMU"). The ACSU 20 processes the quinary symbol data in accordance with the trellis diagram. On the trellis diagram, a code sequence traces its own route, and hence this route is referred to as "path". In the case of the binary code, the Viterbi decoder compares two paths inputted to each node, holds a path having an optimum metric and discards other paths because the selection of path at that time is made optimum regardless of the code sequence in the succeeding stage calculations. The path thus held is referred to as "survivor path". The above-mentioned processes are executed by a recursive calculation method. As an optimum estimation (maximum likelihood estimation) proceeds, the maximum likelihood path (binary code sequence that is encoded first) is stored in the SMU 24.

A branch metric E in the ERP4 is calculated based on the following square error:

$$E = (y_k - c)^2 \quad (1)$$
$$= y_k^2 - 2cy_k + c^2$$

where c is the ideal output obtained from the equalizer 220 in the absence of a noise, and $Y_k$ is the actual output 10 obtained from the equalizer 220.

Considering that c is the quinary data of {-2, -1, 0, +1, +2} and that $y_k^2$ is common in each branch, if $y_k$ is substituted by $2y_k$ for simplicity, the metric on the above-mentioned branch metric E is expressed by the equation (2) below:

$$\begin{cases} 2y_k + 4 & (c = -2) \\ y_k + 1 & (c = -1) \\ 0 & (c = 0) \\ -y_k + 1 & (c = +1) \\ -2y_k + 4 & (c = +2) \end{cases} \quad (2)$$

Figure 5:
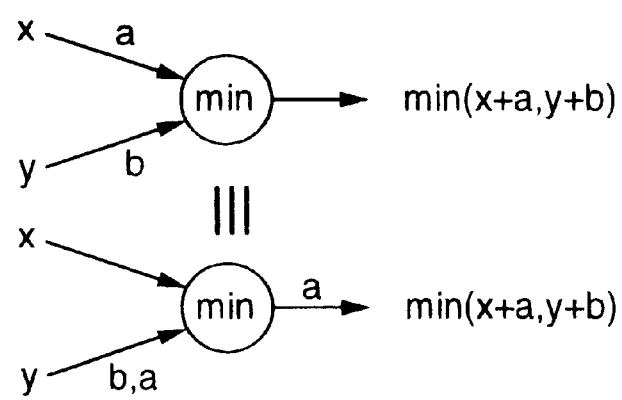
FIG. 5 is a schematic diagram used to explain the manner in which a trellis diagram is transformed under a distributive law according to the prior art.

As a method of reducing complexities of the Viterbi decoder which processes the above-mentioned EPR4 trellis, there is known the transformed EPR trellis which was proposed by G. Fettweise. This is based on an idea that a common operation in the ACS (Add-Compare-Select) is executed in the outside of the ACS as shown in FIG. 5. However, arrows in FIG. 5 mean additions with their numerical values (arrows without numerical values are supplied in such a manner that inputted numerical values are supplied as they are). This shows that the following distributive law is established in the addition and the selection of the minimum value in the ACS.

$$\min(x+a; y+b) = \min(x; y+b-a) + a \quad (3)$$

where min(A;B) is a calculation equation for expressing smaller one of A and B.

Figure 6A:
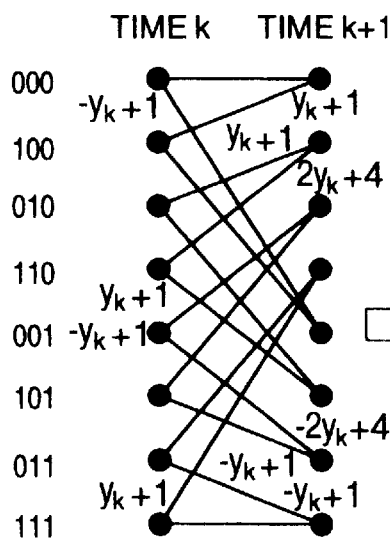
FIGS. 6A through 6C are schematic diagrams used to explain the manner in which trellis diagrams of an extended partial response class 4 are transformed according to the prior art, respectively.
Figure 6B:
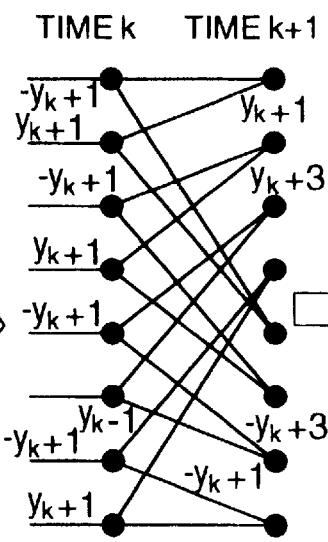
Figure 6C:
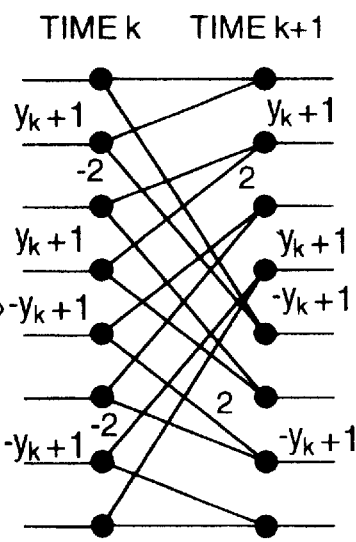

Modifying the EPR4 trellis on the basis of the above-mentioned idea, we have the transformed trellis diagrams shown in FIG. 6A, 6B, 6C.

The manner in which the trellis diagram shown in FIG. 6A is transformed into the trellis diagram shown in FIG. 6B will be described below with reference to one ACS comprising a node 000 and a node 100 of a time k and a node 000 and a node 001 of a time k+1. If the addition of metric $y_k+1$ is carried out on the left-hand side of the node 100 of the time k, no metric at the branch between the node 100 and the node 000 is added any more, and a metric $-y_k+1$ at the branch between the node 100 and the node 001 is added. If the trellis diagram is similarly transformed with respect to other three ACSs, the trellis diagram shown in FIG. 6B is obtained. Then, common operations in the branch shown in FIG. 6B are shifted to the right-hand side, and then added after the path was selected. For example, since metrics of two branches coupled to the node 100 of the time k+1 in FIG. 6B are $y_k+1$ and $y_k+3$, the addition of $y_{k+1}1$ which is the common addition is carried out after the selection of path. If a similar transformation is carried out in the node 110, the node 001, and the node 011 of the time k+1, then there is obtained the trellis diagram shown in FIG. 6C.

Figure 7:
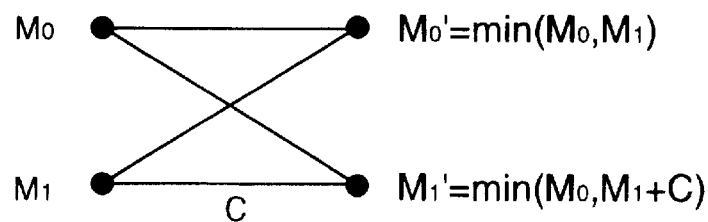
FIG. 7 is a schematic diagram used to explain the manner in which a trellis diagram is transformed according to the prior art.

Inasmuch as any one of the four ACSs includes addition of fixed values (2 or −2) in FIGS. 6A through 6C, one ACS adds fixed values only in one branch as shown in FIG. 7, and the selection of a path having a small metric can be executed with ease as follows:

$M_0$ and $M_1$ assume metrics in the nodes on the left-hand side of one ACS, respectively, $M_0'$ and $M_1'$ assume metrics in the nodes on the right-hand side after the path was selected, respectively, and C assumes a fixed value on the branch. At that time, if C>0, for example, then we have the following equation (4):

$$\begin{cases} M_0' = M_0, & M_1' = M_0 \quad \text{when } M_0 - M_1 < 0 \\ M_0' = M_1, & M_1' = M_0 \quad \text{when } 0 \le M_0 - M_1 < C \\ M_0' = M_1, & M_1' = M_1 + C \quad \text{when } C \le M_0 - M_1 \end{cases} \quad (4)$$

The outline of the transformed EPR4 trellis proposed by G. Fettweise has been described so far.

Although the circuit-scale is reduced to about ½ by the transformed EPR4 trellis, a critical path of operation is still based on the compare-select-add, and hence a calculation speed is not increased satisfactorily.

Figure 8:
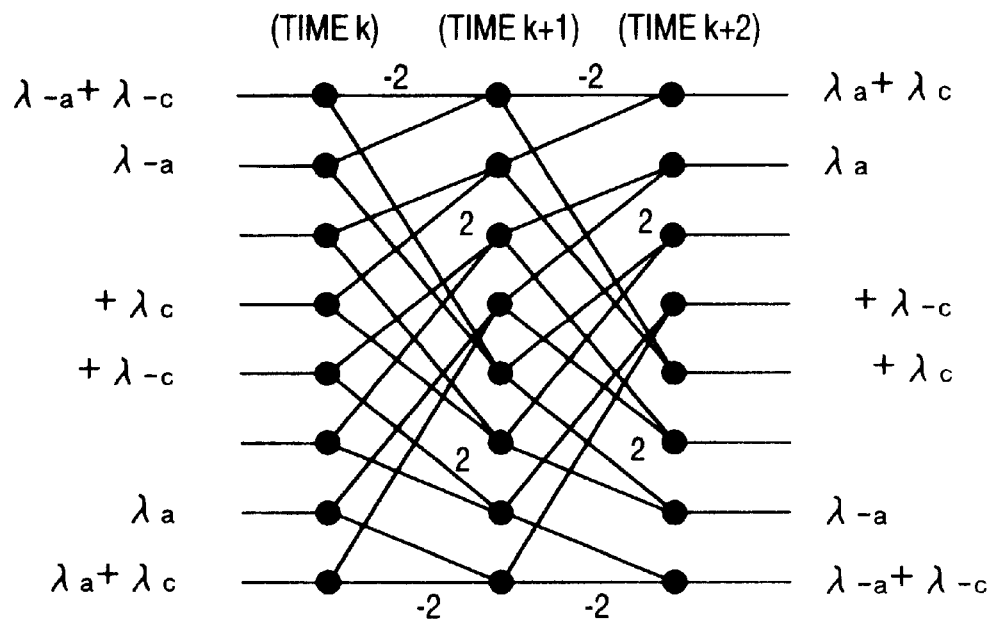
FIG. 8 is a schematic diagram showing trellis diagrams of calculations of two stages in an extended partial response class 4 according to the present invention.
Figure 9:
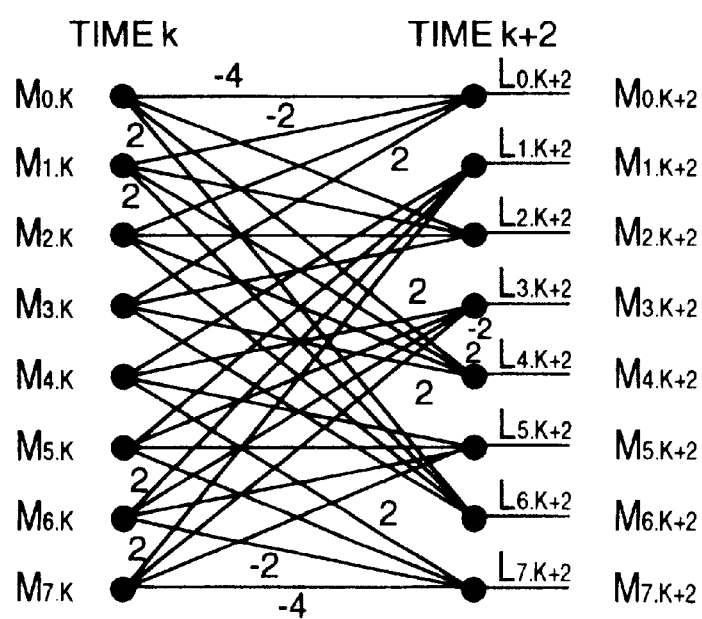
FIG. 9 is a schematic diagram showing a result in which the trellis diagrams of the extended partial response class 4 according to the present invention are transformed into two stages.

On the other hand, according to the present invention, the calculation for the EPR4 trellis of a plurality of stages shown in FIG. 8 is executed by one stage calculation shown in FIG. 9. To this end, the transformation is carried out in such a manner that the calculations for the EPR4 of a plurality of stages are shifted to the outside of the recursive loop of the compare-select. However, the present invention is not limited to the calculation of the EPR4 trellis, and may be applied to the trellises of partial response of other classes. The case of the two-stage calculation will be described hereinafter. In order to understand this transform process of trellis more clearly, the following operators are introduced. As earlier noted, when the minimum values are added and selected in the ACS, the distributive law on the equation (3) is established. An algebraic addition in the equation (3) is expressed by "$\otimes$", and the selection of the minimum value is selected by "$\oplus$". If these operators "$\otimes$" and "$\oplus$" are employed, then the equation (3) is expressed as:

$$x \otimes a \oplus y \otimes b = (x \otimes (y+b-a)) \otimes a \quad (5)$$

The trellis in the two-stage calculation will be simplified by using these operators "$\otimes$" and "$\oplus$". In the following description, the calculation process for calculating a vector $[M_k+2]$ of a time K+2 vector from a vector $[M_k+1]$ of a time k+1 will hereinafter be referred to as "stage calculation (k+1)". The vector $[M_k+2]$ which expresses a metric of each node obtained after the calculation of the stage calculation (k+1) is expressed by the following equation (6) by using a vector $[M_k]$ which expresses a metric of each node at the time of k:

$$[M_{k+2}] = [\lambda_{k+1}] \otimes [\lambda_k] \otimes [M_k] \quad (6)$$

where matrixes $[\lambda_k]$ and $[\lambda_{k+1}]$ are the branch metrics of the stage k and the stage (k+1), and (i, j) elements of the matrixes are branch metrics ranging from j-th node of the preceding time to i-th node of the next time.

Describing the calculation portions concerning the branch metrics on the equation (6) concretely, we have the following equation (7):

$$[\lambda_{k+1}] \otimes [\lambda_k] = \begin{bmatrix} 0 & \lambda_a & & & & & & \\ & & \lambda_a & \lambda_b & & & & \\ & & & & \lambda_{-a} & 0 & & \\ & & & & & & 0 & \lambda_a \\ \lambda_{-a} & 0 & & & & & & \\ & & 0 & \lambda_a & & & & \\ & & & & \lambda_{-b} & \lambda_{-a} & & \\ & & & & & & \lambda_{-a} & 0 \end{bmatrix} \otimes \quad (7)$$

$$\begin{bmatrix} 0 & \lambda_c & & & & & & \\ & & \lambda_c & \lambda_d & & & & \\ & & & & \lambda_{-c} & 0 & & \\ & & & & & & 0 & \lambda_c \\ \lambda_{-c} & 0 & & & & & & \\ & & 0 & \lambda_c & & & & \\ & & & & \lambda_{-d} & \lambda_{-c} & & \\ & & & & & & \lambda_{-c} & 0 \end{bmatrix}$$

$$= \begin{bmatrix} 0 & 0 & \lambda_a & \lambda_a & & & & \\ & & & & \lambda_a & \lambda_a & \lambda_b & \lambda_b \\ \lambda_{-a} & \lambda_{-a} & 0 & 0 & & & & \\ & & & & 0 & 0 & \lambda_a & \lambda_a \\ \lambda_{-a} & \lambda_{-a} & 0 & 0 & & & & \\ & & & & 0 & 0 & \lambda_a & \lambda_a \\ \lambda_{-b} & \lambda_{-b} & \lambda_{-a} & \lambda_{-a} & & & & \\ & & & & \lambda_{-a} & \lambda_{-a} & 0 & 0 \end{bmatrix} +$$

$$\begin{bmatrix} 0 & \lambda_c & \lambda_c & \lambda_d & & & & \\ & & & & \lambda_{-c} & 0 & 0 & \lambda_c \\ \lambda_{-c} & 0 & 0 & \lambda_c & & & & \\ & & & & \lambda_{-d} & \lambda_{-c} & \lambda_{-c} & 0 \\ 0 & \lambda_c & \lambda_c & \lambda_d & & & & \\ & & & & \lambda_{-c} & 0 & 0 & \lambda_c \\ \lambda_{-c} & 0 & 0 & \lambda_c & & & & \\ & & & & \lambda_{-d} & \lambda_{-c} & \lambda_{-c} & 0 \end{bmatrix}$$

where $\lambda_a, \lambda_{-a}, \lambda_b, \lambda_{-b}, \lambda_c, \lambda_{-c}, \lambda_d, \lambda_{-d}$ are the branch metrics. In the equation (7), the values in the matrixes respectively show:

$$\begin{cases} \lambda_a = y_{k+1} + 1 \\ \lambda_b = 2y_{k+1} + 4 = 2\lambda_a + 2 \\ \lambda_{-a} = -y_{k+1} + 1 = -\lambda_a + 2 \\ \lambda_{-b} = -2y_{k+1} + 4 = -\lambda_a + 2 \end{cases} \quad \begin{cases} \lambda_c = y_k + 1 \\ \lambda_d = 2y_k + 4 \\ \lambda_{-c} = -y_k + 1 = -\lambda_c + 2 \\ \lambda_{-d} = -2y_k + 4 = -\lambda_c + 2 \end{cases} \quad (8)$$

Also, the operator "+" in the equation (7) expresses the addition of each element in the matrix. As is clear from the equation (7), the branch metrics based on the inputted signals (equalized outputs $y_k$ and $y_{k+1}$) of the stage calculation (k+1) and the stage calculation k are independently added to the path metrics of the nodes of the stage calculation k. Accordingly, the simplification on the calculation of the branch metrics of the stage calculation (k+1) and the simplification on the calculation of the branch metrics of the stage calculation k may be carried out independently.

(1) To simplify the stage calculation (k+1): This is to simplify the first term of the right-hand side of the equation (7). Arranging metric relationships concerning only the branch metrics of the stage calculation (k+1), we have the following equation (9):

$$\begin{bmatrix} M_{0,k+2} \\ M_{1,k+2} \\ M_{2,k+2} \\ M_{3,k+2} \\ M_{4,k+2} \\ M_{5,k+2} \\ M_{6,k+2} \\ M_{7,k+2} \end{bmatrix} = \begin{bmatrix} 0 & 0 & \lambda_a & \lambda_a & & & & \\ & & & & \lambda_a & \lambda_a & 2\lambda_a+2 & 2\lambda_a+2 \\ \lambda_{-a} & \lambda_{-a} & 0 & 0 & & & & \\ & & & & 0 & 0 & \lambda_a & \lambda_a \\ \lambda_{-a} & \lambda_{-a} & 0 & 0 & & & & \\ & & & & 0 & 0 & \lambda_a & \lambda_a \\ 2\lambda_{-a}+2 & 2\lambda_{-a}+2 & \lambda_{-a} & \lambda_{-a} & & & & \\ & & & & \lambda_{-a} & \lambda_{-a} & 0 & 0 \end{bmatrix} \otimes \begin{bmatrix} M_{0,k} \\ M_{1,k} \\ M_{2,k} \\ M_{3,k} \\ M_{4,k} \\ M_{5,k} \\ M_{6,k} \\ M_{7,k} \end{bmatrix} \quad (9)$$

where i in the matrix $[M_{i,k+2}]$ represents the node NO. Then, $\lambda_b$ and $\lambda_{-b}$ are substituted into $\lambda_b=2\lambda_a+2$ and $\lambda_{-b}=2\lambda_{-a}+2$. To decrease the calculation amount, common calculations in the row direction may be shifted to the rear of the calculations of the branch metrics, and then added together. Also, noting that common calculations in the column direction may be added in advance before the calculations of the branch metrics, the equation (9) can be transformed into the following equation (10):

$$\begin{bmatrix} M_{0,k+2} \\ M_{1,k+2} \\ M_{2,k+2} \\ M_{3,k+2} \\ M_{4,k+2} \\ M_{5,k+2} \\ M_{6,k+2} \\ M_{7,k+2} \end{bmatrix} = \begin{bmatrix} -\lambda_{-a} & -\lambda_{-a} & \lambda_a & \lambda_a & & & & \\ & & & & 0 & 0 & +2 & +2 \\ 0 & 0 & 0 & 0 & & & & \\ & & & & 0 & 0 & 0 & 0 \\ 0 & 0 & 0 & 0 & & & & \\ & & & & 0 & 0 & 0 & 0 \\ +2 & +2 & 0 & 0 & & & & \\ & & & & \lambda_{-a} & \lambda_{-a} & -\lambda_a & \lambda_a \end{bmatrix} \otimes \begin{bmatrix} M_{0,k}+\lambda_{-a} \\ M_{1,k}+\lambda_{-a} \\ M_{2,k} \\ M_{3,k} \\ M_{4,k} \\ M_{5,k} \\ M_{6,k}+\lambda_a \\ M_{7,k}+\lambda_a \end{bmatrix} + \begin{bmatrix} 0 \\ \lambda_a \\ 0 \\ 0 \\ 0 \\ 0 \\ \lambda_{-a} \\ 0 \end{bmatrix} \quad (10)$$

Further, shifting the common calculations of the first and eighth rows behind the metric calculations, the branch metric calculation of the stage calculation (k+1) is finally expressed by the following equation (11):

$$\begin{bmatrix} M_{0,k+2} \\ M_{1,k+2} \\ M_{2,k+2} \\ M_{3,k+2} \\ M_{4,k+2} \\ M_{5,k+2} \\ M_{6,k+2} \\ M_{7,k+2} \end{bmatrix} = \begin{bmatrix} -2 & -2 & 0 & 0 & & & & \\ & & & & 0 & 0 & +2 & +2 \\ 0 & 0 & 0 & 0 & & & & \\ & & & & 0 & 0 & 0 & 0 \\ 0 & 0 & 0 & 0 & & & & \\ & & & & 0 & 0 & 0 & 0 \\ +2 & +2 & 0 & 0 & & & & \\ & & & & 0 & 0 & -2 & -2 \end{bmatrix} \otimes \begin{bmatrix} M_{0,k}+\lambda_{-a} \\ M_{1,k}+\lambda_{-a} \\ M_{2,k} \\ M_{3,k} \\ M_{4,k} \\ M_{5,k} \\ M_{6,k}+\lambda_a \\ M_{7,k}+\lambda_a \end{bmatrix} + \begin{bmatrix} \lambda_a \\ \lambda_a \\ 0 \\ 0 \\ 0 \\ 0 \\ \lambda_{-a} \\ \lambda_{-a} \end{bmatrix} \quad (11)$$

(2) To simplify the stage calculation (k): This is to simplify the second term on the right-hand side of the equation (7). Arranging the metric relationships concerning only the branch metric of the stage calculation (k), we have the following equation (12):

$$\begin{bmatrix} M_{0,k+2} \\ M_{1,k+2} \\ M_{2,k+2} \\ M_{3,k+2} \\ M_{4,k+2} \\ M_{5,k+2} \\ M_{6,k+2} \\ M_{7,k+2} \end{bmatrix} = \begin{bmatrix} 0 & \lambda_c & \lambda_c & 2\lambda_c+2 & & & & \\ & & & & \lambda_{-c} & 0 & 0 & \lambda_c \\ \lambda_{-c} & 0 & 0 & \lambda_c & & & & \\ & & & & 2\lambda_{-c}+2 & \lambda_{-c} & \lambda_{-c} & 0 \\ 0 & \lambda_c & \lambda_c & 2\lambda_c+2 & & & & \\ & & & & \lambda_{-c} & 0 & 0 & \lambda_c \\ \lambda_{-c} & 0 & 0 & \lambda_c & & & & \\ & & & & 2\lambda_{-c}+2 & \lambda_{-c} & \lambda_{-c} & 0 \end{bmatrix} \otimes \begin{bmatrix} M_{0,k} \\ M_{1,k} \\ M_{2,k} \\ M_{3,k} \\ M_{4,k} \\ M_{5,k} \\ M_{6,k} \\ M_{7,k} \end{bmatrix} \quad (12)$$

Shifting the common calculations in the row direction to the rear of the branch metric calculation in the same way as the stage calculation (k+1) is simplified, the above equation (12) is modified into the following equation (13):

$$\begin{bmatrix} M_{0,k+2} \\ M_{1,k+2} \\ M_{2,k+2} \\ M_{3,k+2} \\ M_{4,k+2} \\ M_{5,k+2} \\ M_{6,k+2} \\ M_{7,k+2} \end{bmatrix} = \begin{bmatrix} -\lambda_c & 0 & 0 & \lambda_c+2 & & & & \\ & & & & \lambda_{-c} & 0 & 0 & \lambda_c \\ \lambda_{-c} & 0 & 0 & \lambda_c & & & & \\ & & & & \lambda_{-c}+2 & 0 & 0 & -\lambda_{-c} \\ -\lambda_c & 0 & 0 & \lambda_c+2 & & & & \\ & & & & \lambda_{-c} & 0 & 0 & \lambda_c \\ \lambda_{-c} & 0 & 0 & \lambda_c & & & & \\ & & & & \lambda_{-c}+2 & 0 & 0 & -\lambda_{-c} \end{bmatrix} \otimes \begin{bmatrix} M_{0,k} \\ M_{1,k} \\ M_{2,k} \\ M_{3,k} \\ M_{4,k} \\ M_{5,k} \\ M_{6,k} \\ M_{7,k} \end{bmatrix} + \begin{bmatrix} \lambda_c \\ 0 \\ 0 \\ \lambda_{-c} \\ \lambda_c \\ 0 \\ 0 \\ \lambda_{-c} \end{bmatrix} \quad (13)$$

Further, shifting the common calculations in the column direction to the front of the branch metric calculation, we have the following equation (14):

$$\begin{bmatrix} M_{0,k+2} \\ M_{1,k+2} \\ M_{2,k+2} \\ M_{3,k+2} \\ M_{4,k+2} \\ M_{5,k+2} \\ M_{6,k+2} \\ M_{7,k+2} \end{bmatrix} = \begin{bmatrix} -2 & 0 & 0 & 2 & & & & \\ & & & & 0 & 0 & 0 & 0 \\ 0 & 0 & 0 & 0 & & & & \\ & & & & 2 & 0 & 0 & -2 \\ -2 & 0 & 0 & 2 & & & & \\ & & & & 0 & 0 & 0 & 0 \\ 0 & 0 & 0 & 0 & & & & \\ & & & & 2 & 0 & 0 & -2 \end{bmatrix} \otimes \begin{bmatrix} M_{0,k}+\lambda_{-c} \\ M_{1,k} \\ M_{2,k} \\ M_{3,k}+\lambda_c \\ M_{4,k}+\lambda_{-c} \\ M_{5,k} \\ M_{6,k} \\ M_{7,k}+\lambda_c \end{bmatrix} + \begin{bmatrix} \lambda_c \\ 0 \\ 0 \\ \lambda_{-c} \\ \lambda_c \\ 0 \\ 0 \\ \lambda_{-c} \end{bmatrix} \quad (14)$$

In the above-mentioned process, there was used the following relation (15):

$$\lambda_c + \lambda_{-c} = 2 \quad (15)$$

Expressing the calculations of the branch metrics in the stage calculation (k) and the stage calculation (k+1) together, we have the trellis diagram shown in FIG. 8.

Furthermore, suppose the calculations of the branch metrics of the stage calculation (k) and the stage calculation (k+1) are expressed in such a manner that two constant values, which should be added in the respective paths, are replaced with one constant, then we have a calculated result shown in FIG. 9.

The manner in which the trellis shown in FIG. 8 is transformed into the trellis shown in FIG. 9 will be described below.

With respect to the branch metric, the node of the time k and the node of the time k+2 may be combined directly, and the values of the branch metrics of the stage k and the stage k+1 may be added for the respective paths. In the trellis shown in FIG. 8, a predetermined metric is added before the ACS at the stage k is carried out, and a predetermined metric is added after the ACS at the stage k+1 was ended. The process in which the metric is added before the path is selected on the stage k is carried out at the same time the metric is added after the ACSs at the stage k−2 and the stage k−1 were carried out. Therefore, the above-mentioned addition of metric is omitted from the trellis diagram of FIG. 9. Furthermore, the addition of the metric of the stage k+1 after the ACS calculation is carried out at the same time as the addition of the metrics before the stage k+2 and the stage k+3 are computed, and metric values, which are to be added in each node are expressed as $L_{i,\,k+2}$ (i=0, 1, . . . , 7).

As is clear from the trellis diagram of FIG. 9, it becomes possible to execute the trellis calculations of the original two-stage calculations (FIG. 8) as if the trellis calculations of the two-stage calculations were the trellis calculation of one stage calculation. In addition, the branch metric calculation for the trellises of the two-stage calculations is transformed into the process in which calculated results using the value of the input signal from the path 13 are added after the constants were added and the survivor paths were selected. Also, the process in which the survivor path is selected can be transformed into the process in which four metric differences in the starting node and the constants are compared with each other.

Branch metrics $L_{0,\,k+2}$ through $L_{7,\,k+2}$ using the input signal added after the comparison and selection in FIG. 9 are respectively given by the following equation (16):

$$\begin{cases} L_{0,k+2} = y_k + y_{k+1} - y_{k+2} - y_{k+3} + 4 \\ L_{1,k+2} = y_{k+1} - y_{k+3} + 2 \\ L_{2,k+2} = 0 \\ L_{3,k+2} = -y_k + y_{k+2} + 2 \\ L_{4,k+2} = y_k - y_{k+2} + 2 \\ L_{5,k+2} = 0 \\ L_{6,k+2} = -y_{k+1} + y_{k+3} + 2 \\ L_{7,k+2} = -y_k - y_{k+1} + y_{k+2} + y_{k+3} + 4 \end{cases} \quad (16)$$

where i in the branch metric $L_{i,\,k+2}$ represents the node No.

From the above description, it is to be understood that, if the following calculation steps are executed, then the two-stage calculations of the EPR4 trellis can be carried out together.

STEP 1

To Compare/Select

Survivor paths are selected by using the metrics $M_{0,k}$ through $M_{7,k}$ of the survivor paths and the branch metrics expressed by the constants. As described above, the whole of this calculation can be transformed into the process in which the metric differences of the survivor paths and the constants are compared with each other. For example, the survivor paths of the node of the state 0 in the time (k+2) in FIG. 9 are selected by calculating the following equation (17):

$$\min(M_{0,k-4}, M_{1,k}-2, M_{2,k}, M_{3,k}+2) \quad (17)$$

This calculation on the above equation (17) is transformed into the calculation process in which the differences of six metrics and the constants are compared with each other as shown by the following equation (18):

$$M_{0,k}-M_{1,k} \approx 2, M_{0,k}-M_{2,k} \approx 4, M_{0,k}-M_{3,k} \approx 6$$

$$M_{1,k}-M_{2,k} \approx 2\ M_{1,k}-M_{3,k} \approx 4, M_{2,k}-M_{3,k} \approx 2 \quad (18)$$

where the symbol "$\approx$" is an operation symbol which represents an operation that a smaller one is selected by comparison. In a like manner, FIGS. 10A and 10B show the values of the constants which are compared with metric differences when survivor paths to other nodes are selected, respectively. The suffix k that expresses the time NO. is not shown in FIGS. 10A and 10B. In FIGS. 10A and 10B, the middle columns show path metrics to be compared, and the lower columns show values of constants which are compared with differences of survivor path metrics. FIG. 10A shows constants which are used to select the survivor paths to the 0-th, second, fourth and sixth nodes by using $M_{0,k}$, $M_{1,k}$, $M_{2,k}$ and $M_{3,k}$, and FIG. 10B shows constants which are used to select the survivor paths to the first, third, fifth and seventh nodes by using $M_{4,k}$, $M_{5,k}$, $M_{6,k}$ and $M_{7,k}$, respectively. The survivor paths are determined in accordance with the results obtained when the metric differences and the constants are compared with each other. The node NOs. of the nodes at the time k connected to the i-th nodes of the time (k+2) with the survivor paths are expressed by a survivor sequence pointer SMi (i=0, 1, . . . , 7).

STEP 2

To Add

Metrics of the survivor paths are calculated for the next operation cycle as shown by the following equation (19):

$$M_{i,k+2}=M_{SMi,k}+(\alpha_i+L_{i,k+2})(i=0, 1, \ldots, 7) \quad (19)$$

In the above equation (19), $\alpha_i$ is the branch metric of the constants between the time k and the time (k+2). Since the process in which the branch metric $\alpha_i$ and the branch metrics $L_{i,k+2}$ using the input signal are added can be executed by another operation unit, the calculation in the equation (19) can be executed by one addition.

As described above, the survivor paths of the two-stage calculations can be selected in the operation cycle of compare-select-add by using the trellis comprising the two-stage calculations of the EPR4 trellis.

The ACSU 20 for processing the transformed trellis shown in FIG. 9 will be described with reference to FIG. 11.

Figure 11:
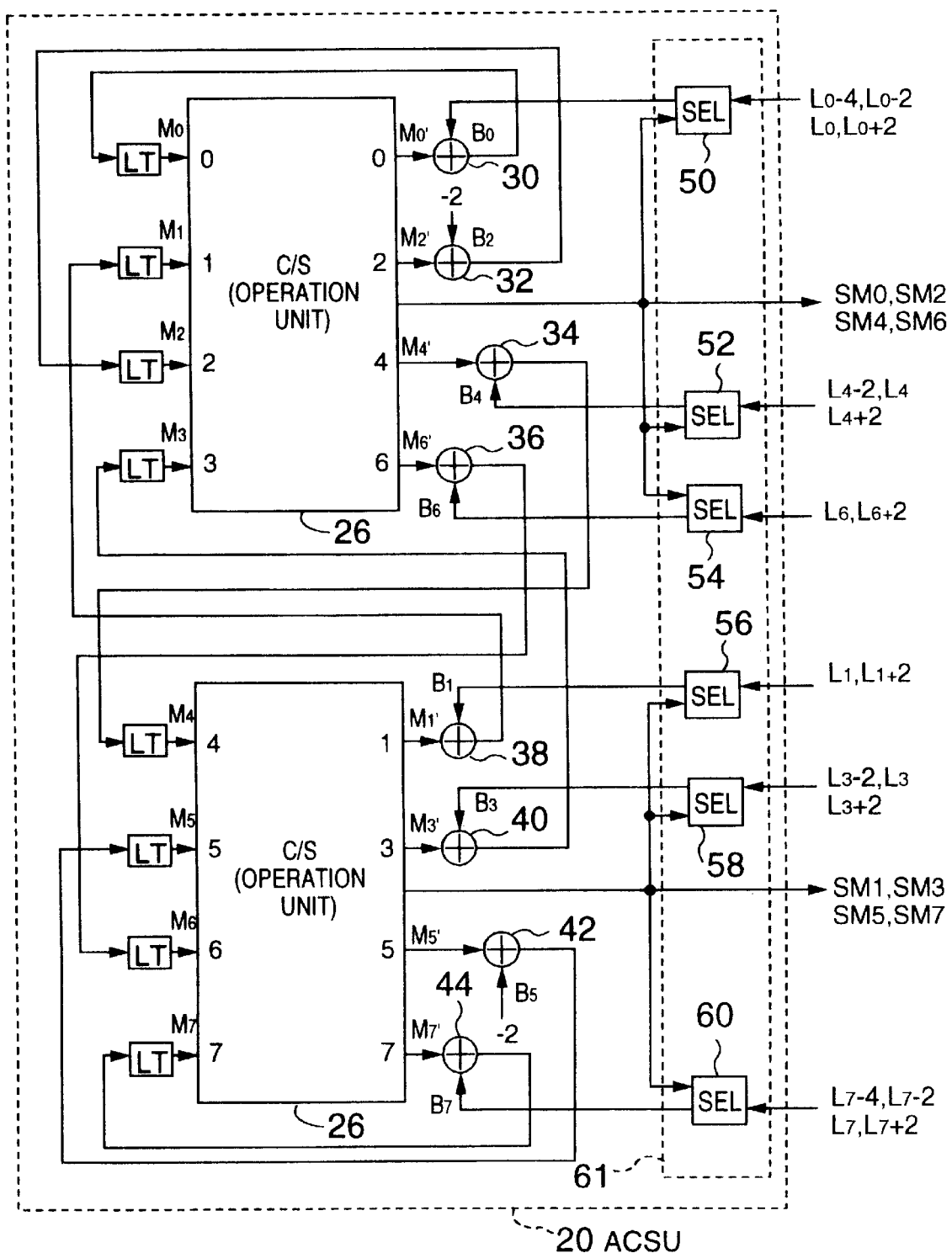
FIG. 11 is a schematic block diagram showing an ACSU (add-compare-select unit) of a Viterbi decoder that is modified so as to act on the trellis diagram of FIG. 9.

In FIG. 11, reference numerals 26, 28 denote operation units (hereinafter simply referred to as "C/S 26, 28") which are used to carry out the above-mentioned compare/select operations. The C/S 26, 28 are adapted to output metrics $M_0'$ through $M_7'$ at the respective stages k of newly selected survivor paths together with survivor sequence pointers SM0, SM2, SM6 and SM1, SM3, SM5, SM7 by comparing four survivor metrics inputted thereto so far. The C/S 26 is the operation unit supplied with $M_{0,k}$, $M_{1,k}$, $M_{2,k}$, $M_{3,k}$ shown in FIG. 9, and then outputs $M_0'$, $M_2'$, $M_4'$, $M_6'$. On the other hand, the C/S 28 is the operation unit supplied with $M_{4,k}$, $M_{5,k}$, $M_{6,k}$, $M_{7,k}$ shown in FIG. 9, and then outputs $M_1'$, $M_3'$, $M_5'$, $M_7'$. The survivor sequence pointers SM0, SM2, SM6, SM1, SM3, SM5, SM7 are also used to control the contents of the SMU 24.

The C/S 26, 28 are adapted only to select the survivor paths, and do not carry out the addition of the above-mentioned constants. Therefore, as will be described later on, the BMU 18 generates branch metric nominates using the constants and the input signal.

In the next addition calculation step, a selector (hereinafter simply referred to as "SEL") 61 selects any one of the branch metric nominates outputted from the BMU 18 in accordance with the survivor sequence pointers SM0 through SM7. Adders 30, 32, 34, 36, 38, 40, 42, 44 are adapted to obtain metrics of respective nodes at the time (k+2) shown in FIG. 9 by adding any of the values ($B_0$ to $B_7$) of the selected branch metrics or the constant value (−2) to the metrics of the respective nodes at the time k in FIG. 9. The results thus obtained are fed back to the corresponding states for executing the next operation cycle.

More specifically, the respective eight states of the trellises on the left-hand side of FIG. 9 are inputted to the C/S 26, 28.

Initially, the C/S 26 will be described below. The outputs $M_0'$, $M_2'$ corresponding to the constants $M_{0,k}$, $M_{2,k}$ in FIG. 9 are supplied from the CIS 26 to the adders 30, 32, in which they are respectively added with the values $B_0$, $B_2$. Resulting sums are memorized in respective registers (each of which is denoted by "LT" in FIG. 11 for simplicity) for executing the next operation cycle, and fed back to the inputs $M_0$, $M_2$ of the C/S 26.

The outputs $M_4'$, $M_6'$ corresponding to the constants $M_{4,k}$, $M_{6,k}$ shown in FIG. 9 are respectively added to the values $B_4$, $B_6$ by the adders 34, 36. Resulting sums are memorized in respective registers (each of which is denoted by "LT" in FIG. 11 for simplicity) for computing the states 1, 3, 5, 7 in the next operation cycle, and fed back to the inputs $M_4$, $M_6$ of the C/S 28.

Similarly, in the C/S 28, the outputs $M_5'$, $M_7'$ corresponding to the constants $M_{5,k}$, $M_{7,k}$ shown in FIG. 9 are supplied to the adders 42, 44, in which they are respectively added to the values $B_5$, $B_7$. Resulting sums are memorized in respective registers (each of which is denoted by "LT" in FIG. 11 for simplicity) for executing the next operation cycle, and fed back to the inputs $M_5$, $M_7$ of the C/S 28.

Furthermore, the outputs $M_1'$, $M_3'$ corresponding to the constants $M_{1,k}$, $M_{3,k}$ shown in FIG. 9 are respectively added to the values $B_1$, $B_3$ by the adders 38, 40. Resulting sums are respectively memorized in registers (each of which is denoted by "LT" in FIG. 11 for simplicity) for calculating the states 0, 2, 4, 6 in the next operation cycle, and fed back to the inputs $M_1$, $M_3$ of the C/S 26.

Figure 12:
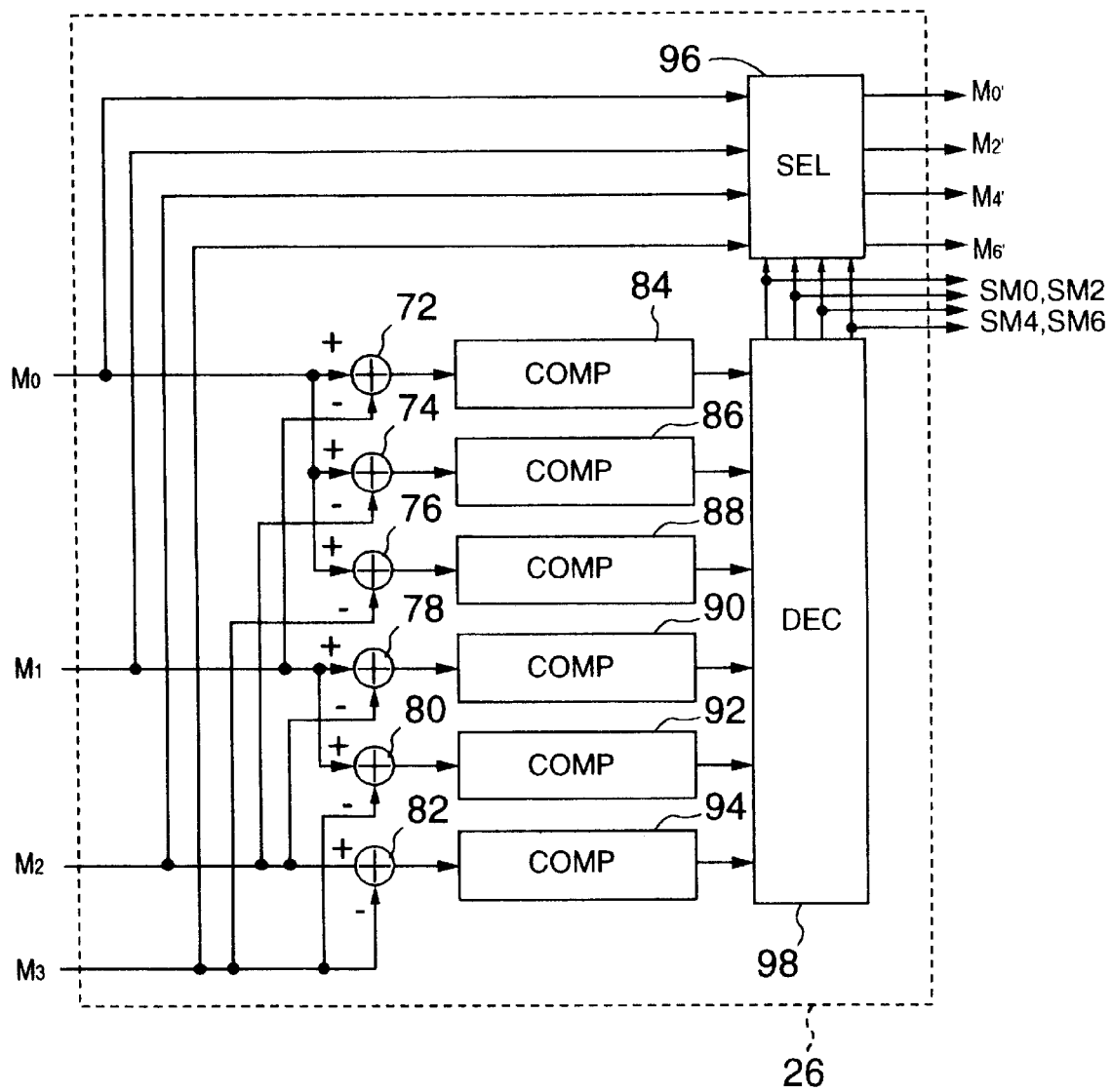
FIG. 12 is a schematic block diagram used to explain a compare/select unit shown in FIG. 11.

FIG. 12 is a block diagram showing the C/S 26 more in detail. Although adders and comparators in the C/S 26 are independently illustrated in FIG. 12, it is needless to say that they may be formed of one operation unit. Metrics of survivor paths in the states 0, 1, 2, 3 are inputted to the C/S 26. Adders 72, 74, 76, 78, 80, 82 are adapted to calculate differences $M_0-M_1$, $M_0-M_2$, $M_0-M_3$, $M_1-M_2$, $M_1-M_3$, $M_2-M_3$ of all combinations of the metrics of the survivor paths. Comparators 84, 86, 88, 90, 92, 94 are each adapted to compare differences of respective metrics and constant values. The constant values that are compared with the differences are those illustrated on FIG. 10A. With respect to the difference $M_0-M_1$, the comparator (hereinafter simply referred to as "COMP") 84 compares 0 and 2. With respect to the difference $M_0-M_2$, the comparator COMP 86 compares −2, 0, 2, and 4. Similar comparisons are effected on the differences $M_0-M_3$, $M_1-M_2$, $M_1-M_3$, $M_2-M_3$ of other survivor path metrics.

A decoder circuit (hereinafter simply referred to as "DEC") 98 determines the survivor paths to the states 0, 2, 4, 6 based on the compared results from the comparators COMP 84, 86, 88, 90, 92, 94.

Figure 13:
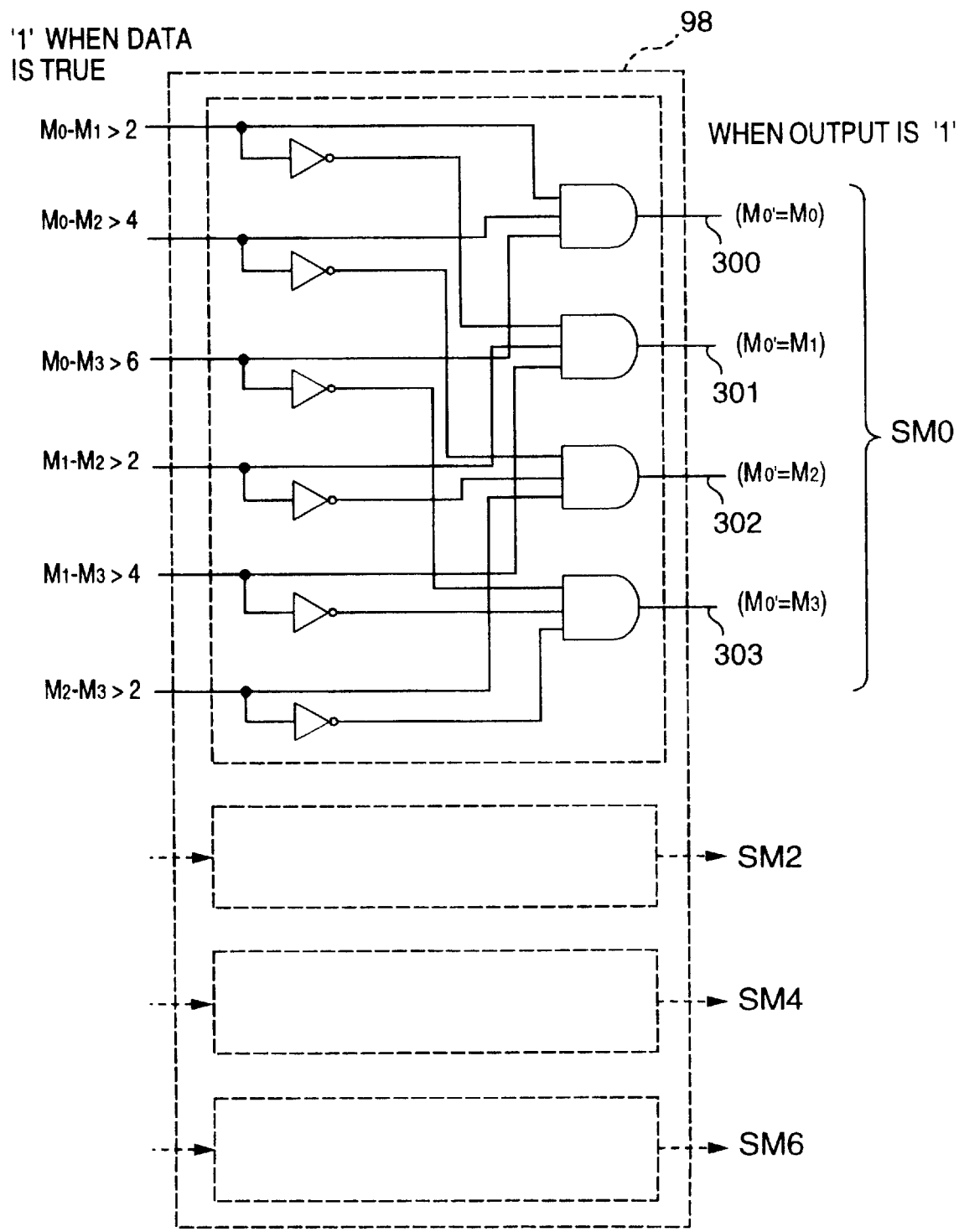
FIG. 13 is a schematic block diagram used to explain a decoder shown in FIG. 12.

FIG. 13 is a block diagram showing the decoder DEC 98 more in detail. The manner in which the survivor path to the state 0, for example, is determined will be described. Inputs from the comparators COMP 84, 86, 88, 90, 92, 94 to the decoder DEC 98 are respectively 2, 4, 6, 2, 4, 2 with respect to the metric differences $M_0-M_1$, $M_0-M_2$, $M_0-M_3$, $M_1-M_2$, $M_1-M_3$, $M_2-M_3$ as shown on the column of the node 0 in FIG. 10A. As a decoded result, a bit "1" is outputted to the position at which the path of the smallest value of $M_0-4$, $M_1-2$, $M_2$, $M_3+2$ from above is illustrated. For example, if an output 300 is "1" and outputs 301 to 303 are "0", then the node 0 at the time k+2 demonstrates that the path from the node 0 at the time k is a survivor path. FIG. 13 shows this fact in the form of $M_0'=M_0$. This is also true in the outputs 301 to 303, and similar operations are effected on the nodes 2, 4, 6. Then, referring back to FIG. 12, outputs SM0, SM2, SM4, SM6 from the decoder DEC 98 are supplied to a selector (hereinafter simply referred to as "SEL") 96 which derives metrics $M_0'$, $M_2'$, $M_4'$, $M_6'$ of the corresponding survivor paths.

While the C/S 26 has been described so far, it is needless to say that similar calculations are carried out in the C/S 28.

Figure 14:
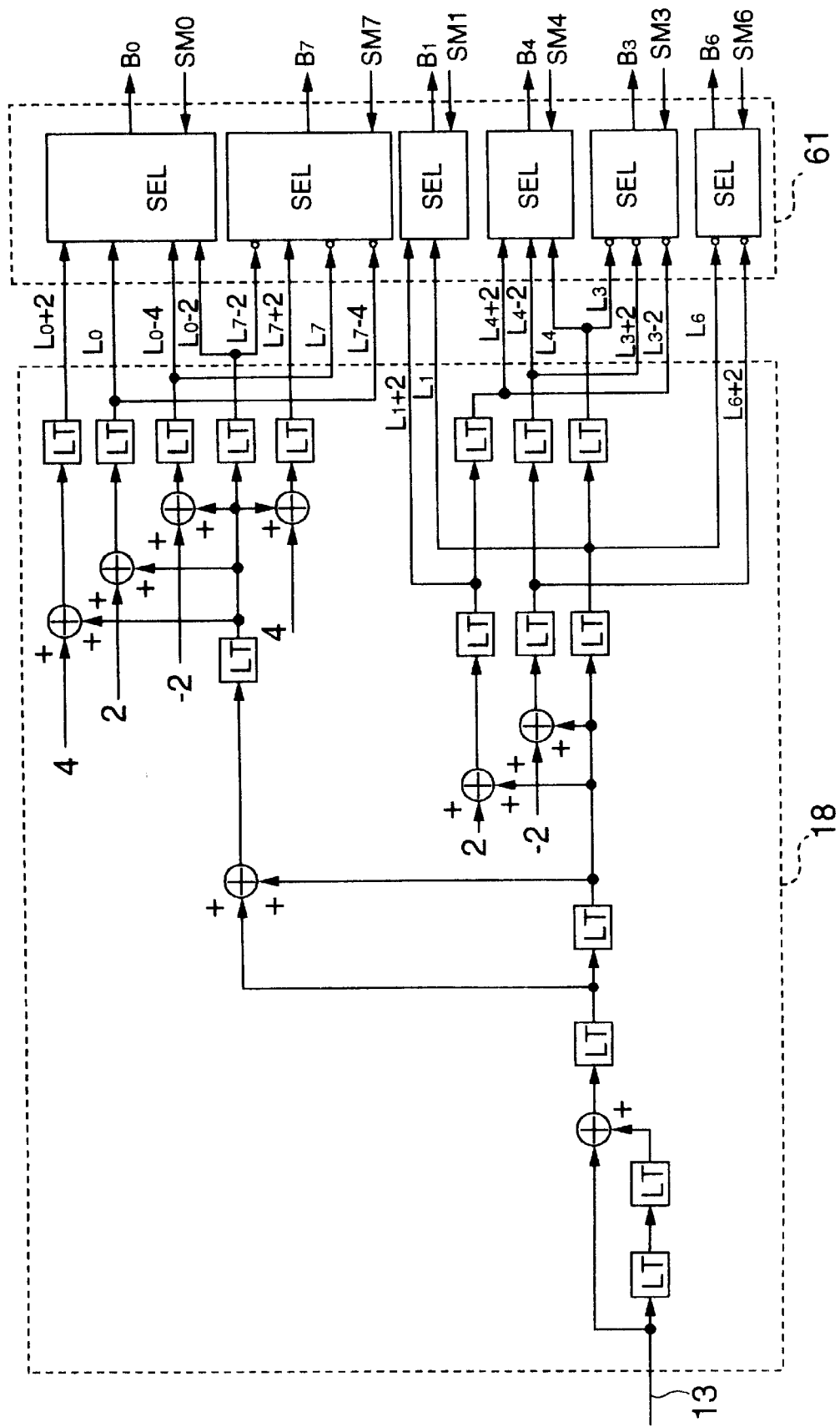
FIG. 14 is a schematic block diagram showing a BMU (branch metric unit) of a Viterbi decoder that is modified so as to act on the trellis diagram of FIG. 9.

FIG. 14 is a block diagram showing the BMU 18 more in detail. The following branch metric nominates become necessary in order to simultaneously add branch metrics using the constants and the input signals after a survivor path was selected.

$$\begin{cases} B_0 = L_0 - 4, L_0 - 2, L_0, L_0 + 2 \\ B_1 = L_1, L_1 + 2 \\ B_2 = -2 \\ B_3 = L_3 - 2, L_3, L_3 + 2 \\ B_4 = L_4 - 2, L_4, L_4 + 2 \\ B_5 = -2 \\ B_6 = L_6, L_6 + 2 \\ B_7 = L_7 - 4, L_7 - 2, L_7, L_7 + 2 \end{cases} \quad (20)$$

All numerical values are obtained from the operation unit shown in FIG. 14. Even when the same value is subtracted from all paths, there is obtained the same result when the survivor path is selected. Therefore, to simplify the operation unit, "2" is subtracted from all values. That is, the calculation is carried out based on the following equation (21):

$$\begin{cases} L_{0,k+2} = y_k + y_{k+1} - y_{k+2} - y_{k+3} + 2 \\ L_{1,k+2} = y_{k+1} - y_{k+3} \\ L_{2,k+2} = -2 \\ L_{3,k+2} = -y_k + y_{k+2} \\ L_{4,k+2} = y_k - y_{k+2} \\ L_{5,k+2} = -2 \\ L_{6,k+2} = -y_{k+1} + y_{k+3} \\ L_{7,k+2} = -y_k - y_{k+1} + y_{k+2} + y_{k+3} + 2 \end{cases} \quad (21)$$

Of the inputs to the selector SEL 61 of the ACSU 20 shown in FIG. 14, inputs having small open circles added thereto indicate that their codes are inverted when they are inputted to the selector SEL 61. The selector SEL 61 in the ASCU 20 is adapted to select branch metrics based on the survivor sequence pointers SMO through SM7 shown in FIG. 12.

The circuit scale of the Viterbi decoder using the above-mentioned method and units according to the present invention will hereinafter be compared with that of the Viterbi decoder using the method and units according to the prior art.

When the trellises of two stages are simultaneously calculated in the prior art shown in FIG. 2, each node requires four variable-adders in order to compute the survivor metrics and the branch metrics, i.e. 32(=4×8) variable-adders, and 48(=6×8) variable-adders are required in order to select the survivor paths. Eventually, the method and units according to the prior art require 80 variable-adders in total.

On the other hand, in the method and units according to the present invention, the ACSU 20 requires 12(=6×2) variable-adders in order to compute the metric differences of the survivor paths shown in FIG. 12, 26 constant-adders in order to compare the metric differences with the constants, 8 adders 30, 32, 34, 36, 38, 40, 42, 44 as constant adders in order to correct the metrics shown in FIGS. 10A, 10B, and two variable-adders and six constant-adders in order to compute the metric corrected values shown in the BMU 18. Thus, 22 variable-adders and 32 constant-adders are required as the operation units in total.

In general, the constant-adder is required to calculate only high-order bits, and hence the constant-adder is simpler than the variable-adder from a circuit arrangement standpoint. Having considered this fact, it is to be noted that the Viterbi decoder based on the method and units according to the present invention can reduce its circuit scale to about 50% as compared with the circuit arrangement composed by the prior-art method and units.

While the BMU 18 shown in FIG. 14 calculates the branch metrics at every stage, the ACSU 20 calculates the branch metrics at every two stages so that each latch (LT) clock of the BMU 18 has a frequency twice as high as the frequency of the clock of each latch (LT) within the ACSU 20.

Figure 18:
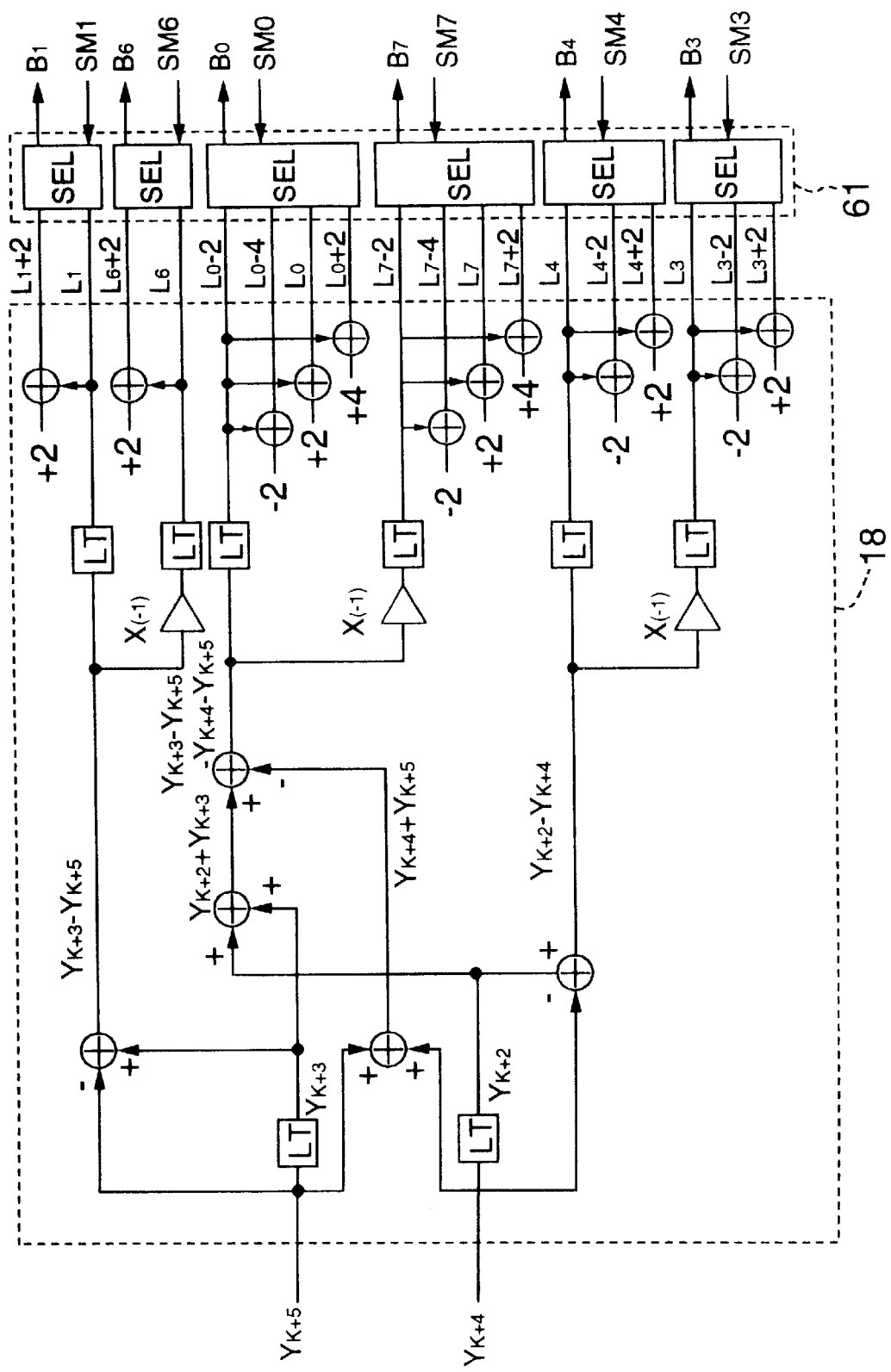
FIG. 18 is a block diagram showing another example of the BMU of the Viterbi decoder which is modified so as to act on the trellis diagram of FIG. 9.

FIG. 18 is a block diagram showing an example of a circuit of the BMU 18 for calculating branch metrics at every two-stage calculation. According to the circuit arrangement shown in FIG. 18, the respective latch (LT) clocks of the BMU 18 and the ACSU 20 have the same frequency so that it becomes possible to reduce a power consumption of the digital signal decoding apparatus much more.

As described above, according to the present invention, to change the Viterbi detection of the extended partial response waveform on the trellis diagram, i.e. to calculate the sampling (reproduced) data of a plurality of consecutive two stages on the trellis diagram can be carried out in a batch processing fashion. In addition, a time required by such calculation can be reduced to substantially ½ by the devised calculation method. Moreover, it is possible to reduce the prior-art circuit scale which is required to simultaneously process the sampling data of the two-stage calculation by approximately 50%.

While the present invention has been described so far with reference to the method in which the branch metric calculation of the two-stage calculation on the trellis diagram is transformed into the one-step calculation based on the path selection process using the branch metrics of the constants and the metric addition to the survivor path and the Viterbi decoder (ACSU 20) based on the above-mentioned method of the present invention, it is needless to say that a calculation of a plurality of consecutive stages more than two stages can be similarly transformed into a similar trellis diagram.

By way of example, the manner in which a trellis diagram of three-stage calculation is simplified and transformed into a trellis diagram of one step will be described. A vector $[M_{k+3}]$ which expresses the metric of each node at the time $(k+3)$ is expressed by using a vector $[M_k]$ which expresses the metric of each node at the time k as follows:

$$[M_{k+3}] = [\lambda_{k+2}] \otimes [\lambda_{k+1}] \otimes [\lambda_k] \otimes [M_k] \quad (22)$$

where matrixes $[\lambda_k]$, $[\lambda_{k+1}]$ and $[\lambda_{k+2}]$ are the branch metrics of the stage calculations (k), (k+1), (k+2), and the (i,j) elements of each matrix are branch metrics ranging from the j-th node of the preceding time to the i-th node of the succeeding time.

Describing the operation portion concerning the branch metric in the above-mentioned equation (22) concretely, the equation (22) is modified into the following equation (23):

The values in the respective matrixes show the following calculations expressed by the equation (24) below:

$$\begin{cases} \lambda_{k+2,1} = y_{k+2} + 1 \\ \lambda_{k+2,2} = 2y_{k+2} + 4 \\ \lambda_{k+2,-1} = -y_{k+2} + 1 \\ \lambda_{k+2,-2} = -2y_{k+2} + 4 \end{cases} \quad \begin{cases} \lambda_{k+1,1} = y_{k+1} + 1 \\ \lambda_{k+1,2} = 2y_{k+1} + 4 \\ \lambda_{k+1,-1} = -y_{k+1} + 1 \\ \lambda_{k+1,-2} = -2y_{k+1} + 4 \end{cases} \text{ and} \quad (24)$$

$$\begin{cases} \lambda_{k,1} = y_k + 1 \\ \lambda_{k,2} = 2y_k + 4 \\ \lambda_{k,-1} = -y_k + 1 \\ \lambda_{k,-2} = -2y_k + 4 \end{cases}$$

Thus, the calculations for the branch metrics of each stage can be independently carried out in the same way as the trellis of the two-stage calculation is simplified. The manner in which metrics of each stage are simplified will hereinafter be described in the sequential order although suffixes expressing the stages of branch metrics are not shown.

(1) To simplify the stage calculation (k+3):

This is equivalent to the simplification of the first term of the right-hand side of the equation (23). Arranging a metric relationship concerning only the branch metric of the stage calculation (k+2), we have the following equation (25):

$$[\lambda_{k+2}] \otimes [\lambda_{k+1}] \otimes [\lambda_k] = \begin{bmatrix} 0 & 0 & 0 & 0 & \lambda_{k+2,1} & \lambda_{k+2,1} & \lambda_{k+2,1} & \lambda_{k+2,1} \\ \lambda_{k+2,1} & \lambda_{k+2,1} & \lambda_{k+2,1} & \lambda_{k+2,1} & \lambda_{k+2,2} & \lambda_{k+2,2} & \lambda_{k+2,2} & \lambda_{k+2,2} \\ \lambda_{k+2,-1} & \lambda_{k+2,-1} & \lambda_{k+2,-1} & \lambda_{k+2,-1} & 0 & 0 & 0 & 0 \\ 0 & 0 & 0 & 0 & \lambda_{k+2,1} & \lambda_{k+2,1} & \lambda_{k+2,1} & \lambda_{k+2,1} \\ \lambda_{k+2,-1} & \lambda_{k+2,-1} & \lambda_{k+2,-1} & \lambda_{k+2,-1} & 0 & 0 & 0 & 0 \\ 0 & 0 & 0 & 0 & \lambda_{k+2,1} & \lambda_{k+2,1} & \lambda_{k+2,1} & \lambda_{k+2,1} \\ \lambda_{k+2,-2} & \lambda_{k+2,-2} & \lambda_{k+2,-2} & \lambda_{k+2,-2} & \lambda_{k+2,-1} & \lambda_{k+2,-1} & \lambda_{k+2,-1} & \lambda_{k+2,-1} \\ \lambda_{k+2,-1} & \lambda_{k+2,-1} & \lambda_{k+2,-1} & \lambda_{k+2,-1} & 0 & 0 & 0 & 0 \end{bmatrix} \otimes \quad (23)$$

$$\begin{bmatrix} 0 & 0 & \lambda_{k+1,1} & \lambda_{k+1,1} & \lambda_{k+1,1} & \lambda_{k+1,1} & \lambda_{k+1,2} & \lambda_{k+1,2} \\ \lambda_{k+1,-1} & \lambda_{k+1,-1} & 0 & 0 & 0 & 0 & \lambda_{k+1,1} & \lambda_{k+1,1} \\ \lambda_{k+1,-1} & \lambda_{k+1,-1} & 0 & 0 & 0 & 0 & \lambda_{k+1,1} & \lambda_{k+1,1} \\ \lambda_{k+1,-2} & \lambda_{k+1,-2} & \lambda_{k+1,-1} & \lambda_{k+1,-1} & \lambda_{k+1,-1} & \lambda_{k+1,-1} & 0 & 0 \\ 0 & 0 & \lambda_{k+1,1} & \lambda_{k+1,1} & \lambda_{k+1,1} & \lambda_{k+1,1} & \lambda_{k+1,2} & \lambda_{k+1,2} \\ \lambda_{k+1,-1} & \lambda_{k+1,-1} & 0 & 0 & 0 & 0 & \lambda_{k+1,1} & \lambda_{k+1,1} \\ \lambda_{k+1,-1} & \lambda_{k+1,-1} & 0 & 0 & 0 & 0 & \lambda_{k+1,1} & \lambda_{k+1,1} \\ \lambda_{k+1,-2} & \lambda_{k+1,-2} & \lambda_{k+1,-1} & \lambda_{k+1,-1} & \lambda_{k+1,-1} & \lambda_{k+1,-1} & 0 & 0 \end{bmatrix} \otimes \begin{bmatrix} 0 & \lambda_{k,1} & \lambda_{k,1} & \lambda_{k,2} & \lambda_{k,-1} & 0 & 0 & \lambda_{k,1} \\ \lambda_{k,-1} & 0 & 0 & \lambda_{k,1} & \lambda_{k,-2} & \lambda_{k,-1} & \lambda_{k,-1} & 0 \\ 0 & \lambda_{k,1} & \lambda_{k,1} & \lambda_{k,2} & \lambda_{k,-1} & 0 & 0 & \lambda_{k,1} \\ \lambda_{k,-1} & 0 & 0 & \lambda_{k,1} & \lambda_{k,-2} & \lambda_{k,-1} & \lambda_{k,-1} & 0 \\ 0 & \lambda_{k,1} & \lambda_{k,1} & \lambda_{k,2} & \lambda_{k,-1} & 0 & 0 & \lambda_{k,1} \\ \lambda_{k,-1} & 0 & 0 & \lambda_{k,1} & \lambda_{k,-2} & \lambda_{k,-1} & \lambda_{k,-1} & 0 \\ 0 & \lambda_{k,1} & \lambda_{k,1} & \lambda_{k,2} & \lambda_{k,-1} & 0 & 0 & \lambda_{k,1} \\ \lambda_{k,-1} & 0 & 0 & \lambda_{k,1} & \lambda_{k,-2} & \lambda_{k,-1} & \lambda_{k,-1} & 0 \end{bmatrix}$$

$$\begin{bmatrix} M_{0,k+3} \\ M_{1,k+3} \\ M_{2,k+3} \\ M_{3,k+3} \\ M_{4,k+3} \\ M_{5,k+3} \\ M_{6,k+3} \\ M_{7,k+3} \end{bmatrix} = \begin{bmatrix} 0 & 0 & 0 & 0 & \lambda_1 & \lambda_1 & \lambda_1 & \lambda_1 \\ \lambda_1 & \lambda_1 & \lambda_1 & \lambda_1 & \lambda_2 & \lambda_2 & \lambda_2 & \lambda_2 \\ \lambda_{-1} & \lambda_{-1} & \lambda_{-1} & \lambda_{-1} & 0 & 0 & 0 & 0 \\ 0 & 0 & 0 & 0 & \lambda_1 & \lambda_1 & \lambda_1 & \lambda_1 \\ \lambda_{-1} & \lambda_{-1} & \lambda_{-1} & \lambda_{-1} & 0 & 0 & 0 & 0 \\ 0 & 0 & 0 & 0 & \lambda_1 & \lambda_1 & \lambda_1 & \lambda_1 \\ \lambda_{-2} & \lambda_{-2} & \lambda_{-2} & \lambda_{-2} & \lambda_{-1} & \lambda_{-1} & \lambda_{-1} & \lambda_{-1} \\ \lambda_{-1} & \lambda_{-1} & \lambda_{-1} & \lambda_{-1} & 0 & 0 & 0 & 0 \end{bmatrix} \otimes \begin{bmatrix} M_{0,k} \\ M_{1,k} \\ M_{2,k} \\ M_{3,k} \\ M_{4,k} \\ M_{5,k} \\ M_{6,k} \\ M_{7,k} \end{bmatrix} \quad (25)$$

Initially, considering that the common calculations of the second and seventh lines can be carried out together behind the branch metric calculation, the equation (25) can be transformed into the following equation (26):

$$\begin{bmatrix} M_{0,k+3} \\ M_{1,k+3} \\ M_{2,k+3} \\ M_{3,k+3} \\ M_{4,k+3} \\ M_{5,k+3} \\ M_{6,k+3} \\ M_{7,k+3} \end{bmatrix} = \begin{bmatrix} 0 & 0 & 0 & 0 & \lambda_1 & \lambda_1 & \lambda_1 & \lambda_1 \\ 0 & 0 & 0 & 0 & \lambda_1+2 & \lambda_1+2 & \lambda_1+2 & \lambda_1+2 \\ \lambda_{-1} & \lambda_{-1} & \lambda_{-1} & \lambda_{-1} & 0 & 0 & 0 & 0 \\ 0 & 0 & 0 & 0 & \lambda_1 & \lambda_1 & \lambda_1 & \lambda_1 \\ \lambda_{-1} & \lambda_{-1} & \lambda_{-1} & \lambda_{-1} & 0 & 0 & 0 & 0 \\ 0 & 0 & 0 & 0 & \lambda_1 & \lambda_1 & \lambda_1 & \lambda_1 \\ \lambda_{-1}+2 & \lambda_{-1}+2 & \lambda_{-1}+2 & \lambda_{-1}+2 & 0 & 0 & 0 & 0 \\ \lambda_{-1} & \lambda_{-1} & \lambda_{-1} & \lambda_{-1} & 0 & 0 & 0 & 0 \end{bmatrix} \otimes \begin{bmatrix} M_{0,k} \\ M_{1,k} \\ M_{2,k} \\ M_{3,k} \\ M_{4,k} \\ M_{5,k} \\ M_{6,k} \\ M_{7,k} \end{bmatrix} + \begin{bmatrix} 0 \\ \lambda_1 \\ 0 \\ 0 \\ 0 \\ 0 \\ \lambda_{-1} \\ 0 \end{bmatrix} \quad (26)$$

Similarly, shifting the calculations of the first, second, fourth and sixth lines to the rear of the branch metric computation, we have the following equation (27):

$$\begin{bmatrix} M_{0,k+3} \\ M_{1,k+3} \\ M_{2,k+3} \\ M_{3,k+3} \\ M_{4,k+3} \\ M_{5,k+3} \\ M_{6,k+3} \\ M_{7,k+3} \end{bmatrix} = \begin{bmatrix} -\lambda_1 & -\lambda_1 & -\lambda_1 & -\lambda_1 & 0 & 0 & 0 & 0 \\ -\lambda_1 & -\lambda_1 & -\lambda_1 & -\lambda_1 & +2 & +2 & +2 & +2 \\ \lambda_{-1} & \lambda_{-1} & \lambda_{-1} & \lambda_{-1} & 0 & 0 & 0 & 0 \\ -\lambda_1 & -\lambda_1 & -\lambda_1 & -\lambda_1 & 0 & 0 & 0 & 0 \\ \lambda_{-1} & \lambda_{-1} & \lambda_{-1} & \lambda_{-1} & 0 & 0 & 0 & 0 \\ -\lambda_1 & -\lambda_1 & -\lambda_1 & -\lambda_1 & 0 & 0 & 0 & 0 \\ \lambda_{-1}+2 & \lambda_{-1}+2 & \lambda_{-1}+2 & \lambda_{-1}+2 & 0 & 0 & 0 & 0 \\ \lambda_{-1} & \lambda_{-1} & \lambda_{-1} & \lambda_{-1} & 0 & 0 & 0 & 0 \end{bmatrix} \otimes \begin{bmatrix} M_{0,k} \\ M_{1,k} \\ M_{2,k} \\ M_{3,k} \\ M_{4,k} \\ M_{5,k} \\ M_{6,k} \\ M_{7,k} \end{bmatrix} + \begin{bmatrix} \lambda_1 \\ 2\lambda_1 \\ 0 \\ \lambda_1 \\ 0 \\ \lambda_1 \\ \lambda_{-1} \\ 0 \end{bmatrix} \quad (27)$$

Shifting the common calculations concerning the columns to the front of the branch metric calculation, finally, we can obtain the following equation (28):

$$\begin{bmatrix} M_{0,k+3} \\ M_{1,k+3} \\ M_{2,k+3} \\ M_{3,k+3} \\ M_{4,k+3} \\ M_{5,k+3} \\ M_{6,k+3} \\ M_{7,k+3} \end{bmatrix} = \begin{bmatrix} -2 & -2 & -2 & -2 & 0 & 0 & 0 & 0 \\ -2 & -2 & -2 & -2 & +2 & +2 & +2 & +2 \\ 0 & 0 & 0 & 0 & 0 & 0 & 0 & 0 \\ -2 & -2 & -2 & -2 & 0 & 0 & 0 & 0 \\ 0 & 0 & 0 & 0 & 0 & 0 & 0 & 0 \\ -2 & -2 & -2 & -2 & 0 & 0 & 0 & 0 \\ +2 & +2 & +2 & +2 & 0 & 0 & 0 & 0 \\ 0 & 0 & 0 & 0 & 0 & 0 & 0 & 0 \end{bmatrix} \otimes \begin{bmatrix} M_{0,k}+\lambda_{-1} \\ M_{1,k}+\lambda_{-1} \\ M_{2,k}+\lambda_{-1} \\ M_{3,k}+\lambda_{-1} \\ M_{4,k} \\ M_{5,k} \\ M_{6,k} \\ M_{7,k} \end{bmatrix} + \begin{bmatrix} \lambda_1 \\ 2\lambda_1 \\ 0 \\ \lambda_1 \\ 0 \\ \lambda_1 \\ \lambda_{-1} \\ 0 \end{bmatrix} \quad (28)$$

(2) To simplify the stage calculation (k+1):

This is equivalent to the simplification of the second term of the right-hand side of the equation (25). Arranging the metric relationship concerning only the branch metrics of the stage calculation (k+1), we have the following equation (29):

$$\begin{bmatrix} M_{0,k+3} \\ M_{1,k+3} \\ M_{2,k+3} \\ M_{3,k+3} \\ M_{4,k+3} \\ M_{5,k+3} \\ M_{6,k+3} \\ M_{7,k+3} \end{bmatrix} = \begin{bmatrix} 0 & 0 & \lambda_1 & \lambda_1 & \lambda_1 & \lambda_1 & \lambda_2 & \lambda_2 \\ \lambda_{-1} & \lambda_{-1} & 0 & 0 & 0 & 0 & \lambda_1 & \lambda_1 \\ \lambda_{-1} & \lambda_{-1} & 0 & 0 & 0 & 0 & \lambda_1 & \lambda_1 \\ \lambda_{-2} & \lambda_{-2} & \lambda_{-1} & \lambda_{-1} & \lambda_{-1} & \lambda_{-1} & 0 & 0 \\ 0 & 0 & \lambda_1 & \lambda_1 & \lambda_1 & \lambda_1 & \lambda_2 & \lambda_2 \\ \lambda_{-1} & \lambda_{-1} & 0 & 0 & 0 & 0 & \lambda_1 & \lambda_1 \\ \lambda_{-1} & \lambda_{-1} & 0 & 0 & 0 & 0 & \lambda_1 & \lambda_1 \\ \lambda_{-2} & \lambda_{-2} & \lambda_{-1} & \lambda_{-1} & \lambda_{-1} & \lambda_{-1} & 0 & 0 \end{bmatrix} \otimes \begin{bmatrix} M_{0,k} \\ M_{1,k} \\ M_{2,k} \\ M_{3,k} \\ M_{4,k} \\ M_{5,k} \\ M_{6,k} \\ M_{7,k} \end{bmatrix} \quad (29)$$

Initially, considering that the common calculations of the first, fourth, fifth and eighth lines can be simultaneously carried out after the branch metric calculation, the above-mentioned equation (29) can be transformed into the following equation (30):

$$\begin{bmatrix} M_{0,k+3} \\ M_{1,k+3} \\ M_{2,k+3} \\ M_{3,k+3} \\ M_{4,k+3} \\ M_{5,k+3} \\ M_{6,k+3} \\ M_{7,k+3} \end{bmatrix} = \begin{bmatrix} -\lambda_1 & -\lambda_1 & 0 & 0 & 0 & 0 & \lambda_1+2 & \lambda_1+2 \\ \lambda_{-1} & \lambda_{-1} & 0 & 0 & 0 & 0 & \lambda_1 & \lambda_1 \\ \lambda_{-1} & \lambda_{-1} & 0 & 0 & 0 & 0 & \lambda_1 & \lambda_1 \\ \lambda_{-1}+2 & \lambda_{-1}+2 & 0 & 0 & 0 & 0 & -\lambda_{-1} & -\lambda_{-1} \\ -\lambda_1 & -\lambda_1 & 0 & 0 & 0 & 0 & \lambda_1+2 & \lambda_1+2 \\ \lambda_{-1} & \lambda_{-1} & 0 & 0 & 0 & 0 & \lambda_1 & \lambda_1 \\ \lambda_{-1} & \lambda_{-1} & 0 & 0 & 0 & 0 & \lambda_1 & \lambda_1 \\ \lambda_{-1}+2 & \lambda_{-1}+2 & 0 & 0 & 0 & 0 & -\lambda_{-1} & -\lambda_{-1} \end{bmatrix} \otimes \begin{bmatrix} M_{0,k} \\ M_{1,k} \\ M_{2,k} \\ M_{3,k} \\ M_{4,k} \\ M_{5,k} \\ M_{6,k} \\ M_{7,k} \end{bmatrix} + \begin{bmatrix} \lambda_1 \\ 0 \\ 0 \\ \lambda_{-1} \\ \lambda_1 \\ 0 \\ 0 \\ \lambda_{-1} \end{bmatrix} \quad (30)$$

Further, shifting the common calculations concerning the columns to the front of the branch metric calculation, we can finally obtain the following equation (31):

$$\begin{bmatrix} M_{0,k+3} \\ M_{1,k+3} \\ M_{2,k+3} \\ M_{3,k+3} \\ M_{4,k+3} \\ M_{5,k+3} \\ M_{6,k+3} \\ M_{7,k+3} \end{bmatrix} = \begin{bmatrix} -2 & -2 & 0 & 0 & 0 & 0 & +2 & +2 \\ 0 & 0 & 0 & 0 & 0 & 0 & 0 & 0 \\ 0 & 0 & 0 & 0 & 0 & 0 & 0 & 0 \\ +2 & +2 & 0 & 0 & 0 & 0 & -2 & -2 \\ -2 & -2 & 0 & 0 & 0 & 0 & +2 & +2 \\ 0 & 0 & 0 & 0 & 0 & 0 & 0 & 0 \\ 0 & 0 & 0 & 0 & 0 & 0 & 0 & 0 \\ +2 & +2 & 0 & 0 & 0 & 0 & -2 & -2 \end{bmatrix} \otimes \begin{bmatrix} M_{0,k}+\lambda_{-1} \\ M_{1,k}+\lambda_{-1} \\ M_{2,k} \\ M_{3,k} \\ M_{4,k} \\ M_{5,k} \\ M_{6,k}+\lambda_1 \\ M_{7,k}+\lambda_1 \end{bmatrix} + \begin{bmatrix} \lambda_1 \\ 0 \\ 0 \\ \lambda_{-1} \\ \lambda_1 \\ 0 \\ 0 \\ \lambda_{-1} \end{bmatrix} \quad (31)$$

(3) To simplify the stage calculation k:

This is equivalent to the simplification of the third term of the right-hand side of the equation (23). Arranging the metric relationship concerning only the branch metric of the stage calculation k, we have the following equation (32):

$$\begin{bmatrix} M_{0,k+3} \\ M_{1,k+3} \\ M_{2,k+3} \\ M_{3,k+3} \\ M_{4,k+3} \\ M_{5,k+3} \\ M_{6,k+3} \\ M_{7,k+3} \end{bmatrix} = \begin{bmatrix} 0 & \lambda_1 & \lambda_1 & \lambda_2 & \lambda_{-1} & 0 & 0 & \lambda_1 \\ \lambda_{-1} & 0 & 0 & \lambda_1 & \lambda_{-2} & \lambda_{-1} & \lambda_{-1} & 0 \\ 0 & \lambda_1 & \lambda_1 & \lambda_2 & \lambda_{-1} & 0 & 0 & \lambda_1 \\ \lambda_{-1} & 0 & 0 & \lambda_1 & \lambda_{-2} & \lambda_{-1} & \lambda_{-1} & 0 \\ 0 & \lambda_1 & \lambda_1 & \lambda_2 & \lambda_{-1} & 0 & 0 & \lambda_1 \\ \lambda_{-1} & 0 & 0 & \lambda_1 & \lambda_{-2} & \lambda_{-1} & \lambda_{-1} & 0 \\ 0 & \lambda_1 & \lambda_1 & \lambda_2 & \lambda_{-1} & 0 & 0 & \lambda_1 \\ \lambda_{-1} & 0 & 0 & \lambda_1 & \lambda_{-2} & \lambda_{-1} & \lambda_{-1} & 0 \end{bmatrix} \otimes \begin{bmatrix} M_{0,k} \\ M_{1,k} \\ M_{2,k} \\ M_{3,k} \\ M_{4,k} \\ M_{5,k} \\ M_{6,k} \\ M_{7,k} \end{bmatrix} \quad (32)$$

Initially, shifting the common calculations concerning the columns to the front of the branch metric calculation, we have the following equation (33):

$$\begin{bmatrix} M_{0,k+3} \\ M_{1,k+3} \\ M_{2,k+3} \\ M_{3,k+3} \\ M_{4,k+3} \\ M_{5,k+3} \\ M_{6,k+3} \\ M_{7,k+3} \end{bmatrix} = \begin{bmatrix} 0 & \lambda_1 & \lambda_1 & \lambda_1+2 & 0 & 0 & 0 & \lambda_1 \\ \lambda_{-1} & 0 & 0 & 0 & \lambda_{-1}+2 & \lambda_{-1} & \lambda_{-1} & 0 \\ 0 & \lambda_1 & \lambda_1 & \lambda_1+2 & 0 & 0 & 0 & \lambda_1 \\ \lambda_{-1} & 0 & 0 & 0 & \lambda_{-1}+2 & \lambda_{-1} & \lambda_{-1} & 0 \\ 0 & \lambda_1 & \lambda_1 & \lambda_1+2 & 0 & 0 & 0 & \lambda_1 \\ \lambda_{-1} & 0 & 0 & 0 & \lambda_{-1}+2 & \lambda_{-1} & \lambda_{-1} & 0 \\ 0 & \lambda_1 & \lambda_1 & \lambda_1+2 & 0 & 0 & 0 & \lambda_1 \\ \lambda_{-1} & 0 & 0 & 0 & \lambda_{-1}+2 & \lambda_{-1} & \lambda_{-1} & 0 \end{bmatrix} \otimes \begin{bmatrix} M_{0,k} \\ M_{1,k} \\ M_{2,k} \\ M_{3,k}+\lambda_1 \\ M_{4,k}+\lambda_{-1} \\ M_{5,k} \\ M_{6,k} \\ M_{7,k} \end{bmatrix} \quad (33)$$

Then, shifting the calculations of the first, third, fifth and seventh rows to the rear of the branch metric calculation, the above-mentioned equation (33) can be transformed into the following equation (34):

$$\begin{bmatrix} M_{0,k+3} \\ M_{1,k+3} \\ M_{2,k+3} \\ M_{3,k+3} \\ M_{4,k+3} \\ M_{5,k+3} \\ M_{6,k+3} \\ M_{7,k+3} \end{bmatrix} = \begin{bmatrix} -\lambda_1 & 0 & 0 & +2 & -\lambda_1 & -\lambda_1 & -\lambda_1 & 0 \\ \lambda_{-1} & 0 & 0 & 0 & \lambda_{-1}+2 & \lambda_{-1} & \lambda_{-1} & 0 \\ -\lambda_1 & 0 & 0 & +2 & -\lambda_1 & -\lambda_1 & -\lambda_1 & 0 \\ \lambda_{-1} & 0 & 0 & 0 & \lambda_{-1}+2 & \lambda_{-1} & \lambda_{-1} & 0 \\ -\lambda_1 & 0 & 0 & +2 & -\lambda_1 & -\lambda_1 & -\lambda_1 & 0 \\ \lambda_{-1} & 0 & 0 & 0 & \lambda_{-1}+2 & \lambda_{-1} & \lambda_{-1} & 0 \\ -\lambda_1 & 0 & 0 & +2 & -\lambda_1 & -\lambda_1 & -\lambda_1 & 0 \\ \lambda_{-1} & 0 & 0 & 0 & \lambda_{-1}+2 & \lambda_{-1} & \lambda_{-1} & 0 \end{bmatrix} \otimes \begin{bmatrix} M_{0,k} \\ M_{1,k} \\ M_{2,k} \\ M_{3,k}+\lambda_1 \\ M_{4,k}+\lambda_{-1} \\ M_{5,k} \\ M_{6,k} \\ M_{7,k} \end{bmatrix} + \begin{bmatrix} \lambda_1 \\ 0 \\ \lambda_1 \\ 0 \\ \lambda_1 \\ 0 \\ \lambda_1 \\ 0 \end{bmatrix} \quad (34)$$

Further, shifting the common computations concerning the columns to the front of the branch metric calculation, we can finally obtain the following equation (35):

$$\begin{bmatrix} M_{0,k+3} \\ M_{1,k+3} \\ M_{2,k+3} \\ M_{3,k+3} \\ M_{4,k+3} \\ M_{5,k+3} \\ M_{6,k+3} \\ M_{7,k+3} \end{bmatrix} = \begin{bmatrix} -2 & 0 & 0 & +2 & -2 & -2 & -2 & 0 \\ 0 & 0 & 0 & 0 & +2 & 0 & 0 & 0 \\ -2 & 0 & 0 & +2 & -2 & -2 & -2 & 0 \\ 0 & 0 & 0 & 0 & +2 & 0 & 0 & 0 \\ -2 & 0 & 0 & +2 & -2 & -2 & -2 & 0 \\ 0 & 0 & 0 & 0 & +2 & 0 & 0 & 0 \\ -2 & 0 & 0 & +2 & -2 & -2 & -2 & 0 \\ 0 & 0 & 0 & 0 & +2 & 0 & 0 & 0 \end{bmatrix} \otimes \begin{bmatrix} M_{0,k}+\lambda_{-1} \\ M_{1,k} \\ M_{2,k} \\ M_{3,k}+\lambda_1 \\ M_{4,k}+2\lambda_{-1} \\ M_{5,k}+\lambda_{-1} \\ M_{6,k}+\lambda_{-1} \\ M_{7,k} \end{bmatrix} + \begin{bmatrix} \lambda_1 \\ 0 \\ \lambda_1 \\ 0 \\ \lambda_1 \\ 0 \\ \lambda_1 \\ 0 \end{bmatrix} \quad (35)$$

Figure 15:
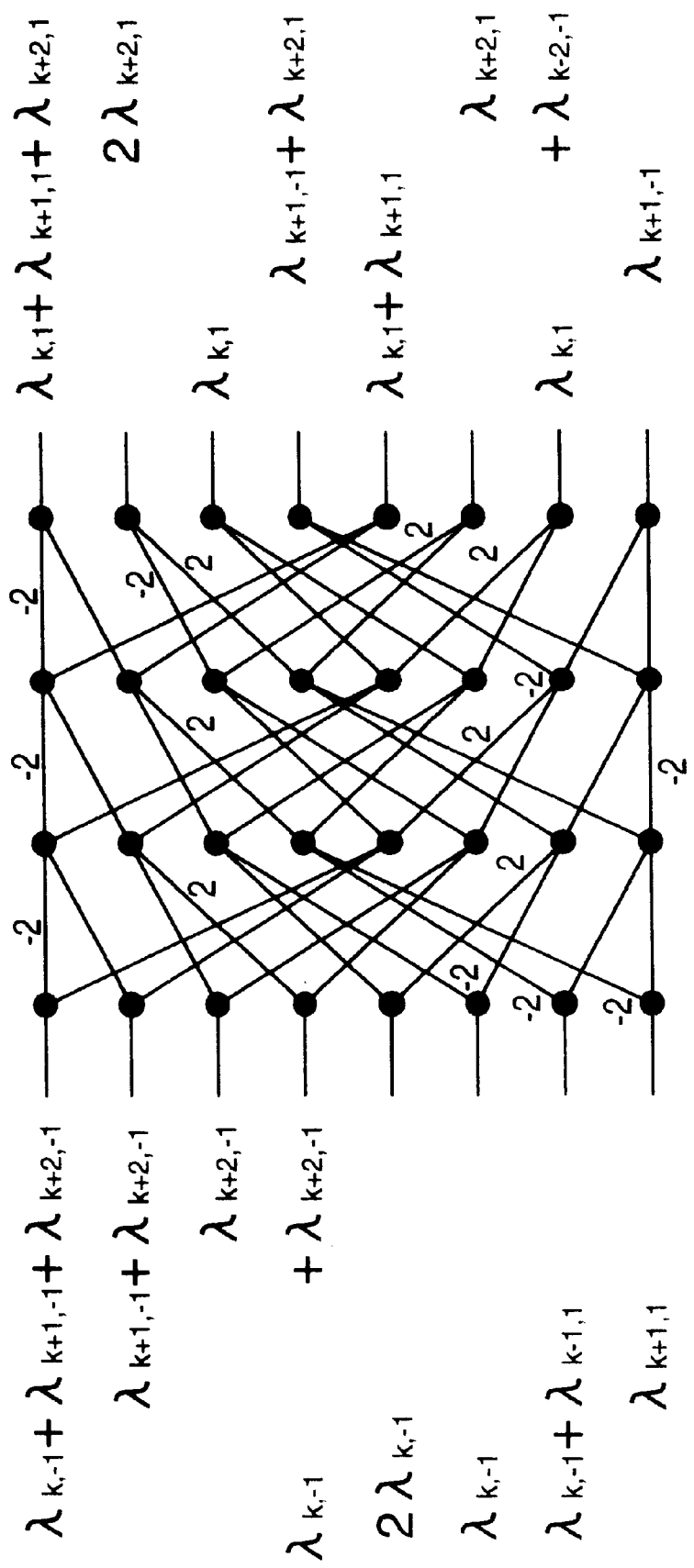
FIG. 15 is a diagram showing a trellis diagram of calculations of three stages of the extended partial response class 4 according to the present invention.

Expressing the calculations of the stage calculations k, k+1, k+2 together, the trellis diagram of three-stage calculation shown in FIG. 15 can be obtained.

Figure 16:
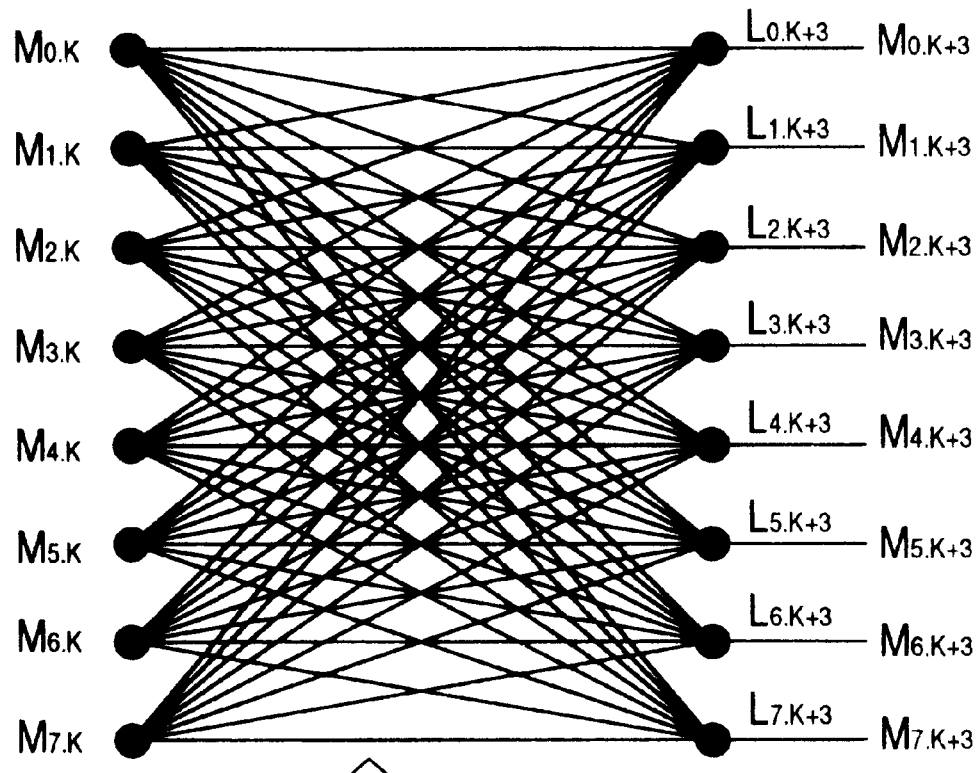
FIG. 16 is a diagram showing a trellis diagram of an extended partial response class 4 according to the present invention in which a calculation of three stages is modified into a calculation of one stage.

Further, expressing the branch metric calculations of three-stage calculations of the stage calculations k, k+1, k+2 together, the transformed result illustrated in FIG. 16 can be obtained.

As is clear from FIG. 16, it becomes possible to execute the trellis calculation of the original three-stage calculation as if the trellis calculation of the three-stage calculation were the trellis calculation of one stage. In addition, the branch metric calculations for the three-stage trellis are all transformed into the additions of the constants and the addition of computed results using the value of the inputted signal from the path 13 after the survivor path was selected. Furthermore, the selection of the survivor path can be transformed into the comparison between the eight metric differences at the starting node and the constants.

In FIG. 16, the branch metrics $L_{0,k+3}$ to $L_{7,k+3}$ using the input signal added after the comparison and the selection are respectively expressed by the following equation (36):

$$\begin{cases} L_{0,k+3} = \lambda_{k,1} + \lambda_{k+1,1} + \lambda_{k+2,1} + \lambda_{k+3,-1} + \lambda_{k+4,-1} + \lambda_{k+5,-1} \\ L_{1,k+3} = 2\lambda_{k+2,1} + \lambda_{k+4,-1} + \lambda_{k+5,-1} \\ L_{2,k+3} = \lambda_{k,1} + \lambda_{k+5,-1} \\ L_{3,k+3} = \lambda_{k+1,-1} + \lambda_{k+2,1} + \lambda_{k+3,-1} + \lambda_{k+5,-1} \\ L_{4,k+3} = \lambda_{k,1} + \lambda_{k+1,1} + \lambda_{k+3,-1} \\ L_{5,k+3} = \lambda_{k+2,1} + \lambda_{k+3,-1} \\ L_{6,k+3} = \lambda_{k,1} + \lambda_{k+2,-1} + \lambda_{k+3,-1} + \lambda_{k+4,1} \\ L_{7,k+3} = \lambda_{k+1,-1} + \lambda_{k+4,1} \end{cases} \quad (36)$$

The three-stage calculations of the EPR4 trellis can be processed together hereinafter in a batch processing fashion similarly to the above-mentioned trellis processing of two-stage calculations.

While the code sequence is based on the extended partial response class 4 (EPR4) as described above, the present invention is not limited thereto, and may be similarly applied to an extended partial response EnPR4 ($n \geq 2$) which is further extended to n-tuple.

What is claimed is:

1. A Viterbi decoder for generating a binary code sequence from a convolutional coding input data symbol sequence by a maximum likelihood estimation, comprising:
   branch metric calculating means for calculating branch metric nominates, which had been processed by n-stage ($n \geq 2$) calculation at every node, independently of survivor path metrics by using said input signal and constants of a plurality of consecutive stages;
   compare-select-add means for selecting a survivor path reaching the n-stage calculated state and branch metrics of every node from metrics of each node at a present time, and adding said branch metrics of every node to the metrics of said selected survivor path; and
   whereby a plurality of trellis operations corresponding to a plurality of decoding stages of signals can be processed by one operation step.

2. A Viterbi decoder as claimed in claim 1, wherein said compare-select-add means includes:
   means for generating survivor sequence pointers for determining a survivor path by comparing differences between the metrics of each node at the present time and constants;
   compare-select means for selecting and outputting the metrics of the survivor path reaching to said n-stage calculated state by using said survivor sequence pointers;
   selecting means for selecting the branch metrics of every node by using said survivor sequence pointers; and
   adding means for adding said branch metrics of every node to the metrics of said selected survivor path.

3. A Viterbi decoder as claimed in claim 1, wherein said branch metric calculating means includes means for carrying out a stage calculation of n=2.

4. A Viterbi decoder as claimed in claim 1, wherein said convolutional coding input data symbol sequence is an extended partial response class 4.

5. A Viterbi decoder as claimed in claim 1, wherein said compare-select means includes:

registers for holding four survivor metrics;

six metric subtractors supplied with metrics of said held four survivor paths and calculating differences among respective metrics;

comparators for comparing said difference results with a plurality of constants;

a decoder supplied with compared results and outputting said survivor sequence pointers; and selectors for selecting metrics of a new survivor path from the metrics of said inputted four survivor paths based on said decision signal.

6. A Viterbi decoder as claimed in claim 1, wherein said convolutional coding input data symbol sequence is an extended partial response class 4 (EmPR4) which is extended to m (m≧2)-fold.

7. A digital signal decoding apparatus for decoding a binary code sequence from a read data symbol sequence read out from a magnetic recording medium, comprising:

branch metric calculating means for calculating branch metric nominates in n stage (n≧2) calculated state at every node independently of metrics of a survivor path by using said read data symbol sequence and constants of a plurality of consecutive stages so as to generate said binary code sequence from said read data symbol sequence by a maximum likelihood estimation;

a Viterbi decoder having compare-select-add means for selecting survivor paths reaching said n-state calculated state and branch metrics of every node from metrics of every node at a present time and adding said branch metrics of said every node to metrics of said selected survivor paths; and whereby a plurality of trellis operations corresponding to a plurality of decoding stages of signals can be processed by one operation step.

8. A magnetic recording system comprising:

a magnetic recording medium in which encoded data encoded from a binary code sequence by a convolutional coding;

read means for reading out said encoded data from said magnetic recording medium; and a digital signal decoding apparatus for decoding said binary code sequence from read data symbol sequence which is read out as said encoded data by said read means;

said digital signal decoding apparatus comprising:

branch metric calculating means for calculating branch metric nominates of n stage (n≧2) calculated state at every node independently of survivor paths by using said read data symbol sequence and constants of a plurality of consecutive stages so as to generate said binary code sequence from said read data symbol sequence by a maximum likelihood estimation;

a Viterbi decoder having compare-select-add means for selecting said survivor paths reaching said n-stage calculated state and branch metrics of every node from metrics of each node at a present time and adding said branch metrics of said every node to the metrics of said selected survivor paths; and whereby a plurality of trellis operations corresponding to a plurality of decoding stages of signals can be processed by one operation step.

9. A method of decoding a binary code sequence from encoded input data symbol sequence of a plurality of consecutive stages by a maximum likelihood estimation, comprising the steps of:

selecting survivor paths reaching n stage (n≧2) calculated state by comparing differences among the metrics of survivor paths of each node at a present time with predetermined constant values;

calculating branch metric nominates of said n stage calculated state at every node independently of the metrics of said survivor paths by using inputted data and constants of a plurality of consecutive stages;

selecting branch metrics from said branch metric nominates based on said selected survivor paths in said n stage calculated state and obtaining the metrics of survivor paths of n stage calculated state by adding the resulting branch metrics to said metrics of said selected survivor paths; and whereby a plurality of trellis operations corresponding to a plurality of decoding stages of signals can be processed by one operation step.

\* \* \* \* \*